(12) United States Patent
Nishimura et al.

(10) Patent No.: US 9,257,387 B2
(45) Date of Patent: Feb. 9, 2016

(54) SEMICONDUCTOR DEVICE AND METHOD OF MANUFACTURING THE SAME

(71) Applicant: ROHM CO., LTD., Kyoto (JP)

(72) Inventors: Isamu Nishimura, Kyoto (JP); Michihiko Mifuji, Kyoto (JP); Kazumasa Nishio, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/824,962

(22) Filed: Aug. 12, 2015

(65) Prior Publication Data

US 2015/0348900 A1 Dec. 3, 2015

Related U.S. Application Data

(62) Division of application No. 14/181,100, filed on Feb. 14, 2014, now Pat. No. 9,136,216.

(30) Foreign Application Priority Data

Feb. 27, 2013 (JP) .................................. 2013-37578

(51) Int. Cl.
| | | |
|---|---|---|
| *H01L 21/02* | (2006.01) | |
| *H01L 23/522* | (2006.01) | |
| *H01L 23/528* | (2006.01) | |
| *H01L 27/01* | (2006.01) | |
| *H01L 49/02* | (2006.01) | |

(52) U.S. Cl.
CPC .......... *H01L 23/5223* (2013.01); *H01L 23/528* (2013.01); *H01L 23/5226* (2013.01); *H01L 23/5228* (2013.01); *H01L 27/016* (2013.01); *H01L 28/24* (2013.01); *H01L 28/60* (2013.01)

(58) Field of Classification Search
CPC ............ H01L 23/5223; H01L 23/5228; H01L 23/5258; H01L 23/53223; H01L 27/016; H01L 28/24; H01L 28/60
USPC .................................. 257/536, 154, 384, 532
See application file for complete search history.

(56) References Cited

U.S. PATENT DOCUMENTS

| | | | | |
|---|---|---|---|---|
| 5,609,773 A | * | 3/1997 | Usui ................... | H01L 21/4857 216/100 |
| 7,394,145 B2 | | 7/2008 | Chinthakindi et al. | |
| 7,704,848 B2 | | 4/2010 | Ueshima | |
| 2001/0025993 A1 | * | 10/2001 | Inoue .................. | H01L 23/5382 257/355 |
| 2002/0060351 A1 | * | 5/2002 | Shin ....................... | H01L 28/20 257/536 |

(Continued)

FOREIGN PATENT DOCUMENTS

| | | |
|---|---|---|
| JP | 2005-235888 A | 9/2005 |
| JP | 2009-147219 A | 7/2009 |
| JP | 2011-138993 A | 7/2011 |

*Primary Examiner* — Nicholas Tobergte
(74) *Attorney, Agent, or Firm* — Chen Yoshimura LLP

(57) ABSTRACT

A semiconductor device has a resistor area and wiring area selectively disposed on a semiconductor substrate. In this semiconductor device, a second interlayer insulating film is formed above the semiconductor substrate, and a thin-film resistor is disposed on the second interlayer insulating film in the resistor area. Vias that contact the thin-film resistor from below are formed in the second interlayer insulating film. A wiring line is disposed on the second interlayer insulating film in the wiring area. A dummy wiring line that covers the thin-film resistor from above is disposed in a third wiring layer that is in the same layer as the wiring line, and an insulating film is interposed between the thin-film resistor and the dummy wiring line.

11 Claims, 28 Drawing Sheets

(56) References Cited

U.S. PATENT DOCUMENTS

| | | | |
|---|---|---|---|
| 2003/0184311 A1* | 10/2003 | Otsuka | H01L 23/5223 324/538 |
| 2004/0026762 A1* | 2/2004 | Hirano | H01L 28/30 257/536 |
| 2005/0212085 A1 | 9/2005 | Hashimoto et al. | |
| 2008/0054404 A1* | 3/2008 | Ueshima | G06F 17/5068 257/536 |
| 2010/0025817 A1* | 2/2010 | Mihara | H01L 27/11509 257/532 |

* cited by examiner

SEMICONDUCTOR DEVICE AND METHOD OF MANUFACTURING THE SAME

This application is a divisional application of a pending application, U.S. application Ser. No. 14/181,100 filed on Feb. 14, 2014, which is hereby incorporated by reference in its entirety. This application claims the benefit of Japanese Application No. 2013-37578, filed in Japan on Feb. 27, 2013, which is hereby incorporated by reference in its entirety.

BACKGROUND OF THE INVENTION

1. Field of the Invention

The present invention relates to a semiconductor device having a thin-film resistor and a method of manufacturing this semiconductor device.

2. Description of Related Art

In high-performance analog devices, it is necessary to have passive parts including thin-film resistors (TaN, SiCr, or the like, for example) that are capable of being laser trimmed. Examples of semiconductor devices provided with thin-film resistors are respectively disclosed in Patent Documents 1 to 3, for example.

Disclosed in Patent Document 1 is a semiconductor device that includes a thin-film resistor formed on a semiconductor substrate, a middle metal layer formed so as to cover the thin-film resistor, an insulating film formed so as to cover the middle metal layer, and a wiring line connected to the middle metal layer through a contact hole formed in the insulating film.

Patent Document 2 discloses a semiconductor device that includes an interlayer insulating film formed on a silicon substrate, a tantalum nitride (TaN) film formed on the interlayer insulating film, and a via connected to the tantalum nitride film through a via hole formed in the interlayer insulating film.

Patent Document 3 discloses a semiconductor device that includes an interlayer insulating film formed on a silicon substrate, wiring patterns formed on the interlayer insulating film, and a CrSi thin-film resistor that is formed so as to intersect a pair of the wiring patterns facing each other and that is connected to these wiring patterns.

RELATED ART DOCUMENTS

Patent Documents

Patent Document 1: Japanese Patent Application Laid-Open Publication No. 2009-147219
Patent Document 2: Japanese Patent Application Laid-Open Publication No. 2011-138993
Patent Document 3: Japanese Patent Application Laid-Open Publication No. 2005-235888

SUMMARY OF THE INVENTION

If a contact is formed on the thin-film resistor from above, as in Patent Documents 1 and 2, it is necessary to form a via hole (contact hole) that reaches the thin-film resistor by selectively etching the interlayer insulating film. Therefore, there is a risk that the top of the thin-film resistor could be damaged by being exposed to etching gas, the etchant, or the like. If wet etching is used, as in Patent Document 2, the damage may be slightly reduced, but a separate etching mask is then necessary to form the via hole to the thin-film resistor. As a result, the efficiency of the manufacturing process is inevitably worsened and the cost is increased.

Sometimes, the contact is formed from below the wiring line provided with the thin-film resistor. Accordingly, if the barrier film that forms the bottom of the wiring line is also used as the thin-film resistor, then the wiring line and the via hole therebelow connecting to the thin-film resistor can be formed at the same time, and damage caused by etching gas or the like may be avoided due to the thin-film resistor being formed after the bottom via hole is formed.

However, the barrier film of the wiring line contacting the via below is a material that has the same resistance as the thin-film resistor; thus, there is a risk that variation in contact resistance will occur between the via and the wiring line. Furthermore, if it is necessary to remove a primary part of the wiring line (Al alloy wiring, for example) from the area above the thin-film resistor used for resistance, then there is a risk the thin-film resistor could be damaged during etching to remove this.

If the thin-film resistor is formed on the wiring line pattern, as in Patent Document 3, differences in thickness of the wiring line can appear on the thin-film resistor, and therefore, there is a risk that deviation will occur in the resistance of the thin-film resistor.

The present invention aims at providing a semiconductor device that can eliminate etching damage in the thin-film resistor while preventing an increase in contact resistance with the wiring line, and a method of manufacturing this semiconductor device.

In addition to the above-mentioned aim, the present invention aims at providing a semiconductor device that can further suppress deviation in resistance, and a method of manufacturing this semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in a first aspect, the present invention is a semiconductor device having a resistor area and a wiring area selectively disposed on a semiconductor substrate, including: an interlayer insulating film disposed above the semiconductor substrate; a thin-film resistor that is disposed on the interlayer insulating film and is in the resistor area; a via that is formed in the interlayer insulating film and that contacts the thin-film resistor from below; a wiring line that is disposed above the interlayer insulating film and is in the wiring area; a dummy wiring line that is disposed in a wiring layer in the same layer as the wiring line and that covers the thin-film resistor from above; and an insulating film interposed between the thin-film resistor and the dummy wiring line.

This semiconductor device can be manufactured by a fourteenth aspect of the present invention, which is described later. The fourteenth aspect of the present invention, described later, is a method of manufacturing a semiconductor device having a resistor area and wiring area selectively disposed on a semiconductor substrate, including: forming an interlayer insulating film on the semiconductor substrate; forming a via in the interlayer insulating film such that the via is selectively exposed on a top of the interlayer insulating film in the resistor area; forming a thin-film resistor on the interlayer insulating film such that the thin-film resistor is in contact with the exposed via; forming an insulating film that covers the thin-film resistor; forming a wiring line on the interlayer insulating film in the wiring area and simultaneously forming a dummy wiring line such that the dummy wiring line covers the thin-film resistor from above via the insulating film.

With this method, the wiring line and thin-film resistor are formed in different steps; therefore, a material that is preferable for wiring can be used as the wiring line, and a material that is preferable for resistance can be used as the thin-film resistor. This can prevent an increase in contact resistance with the wiring line.

Furthermore, the thin-film resistor is protected by the dummy wiring line disposed in the wiring layer that is in the same layer as the wiring line, and thus, etching damage to the thin-film resistor can be prevented during patterning of the wiring line. When an opening for trimming the thin-film resistor is formed above the thin-film resistor by etching, such etching can be stopped by the dummy wiring line. Therefore, it is possible to prevent damage caused by the etching. If the portion exposed to the opening for trimming is a metal such as the material the dummy wiring line is made of, then the laser trimming thereafter can be performed with more stability than if an insulating material were being exposed.

The (contact) vias are disposed below the thin-film resistor; thus, an etching mask for these via holes can be shared when forming the vias that contact the wiring line from below in the interlayer insulating film. Accordingly, it is possible to suppress degradation in efficiency of the manufacturing process and an increase in cost.

Furthermore, the resistor area and the wiring area are separate, and there is no wiring line interposed between the thin-film resistor and the interlayer insulating film. Therefore, the flatness of the thin-film resistor can be ensured. Due to this, differences in resistance of the thin-film resistor can be eliminated or reduced.

A second aspect of the present invention is the first aspect of the present invention, wherein the dummy wiring line includes overlapping parts that cover the thin-film resistor from sides thereof.

With this configuration, moisture can be prevented from entering from the sides of the thin-film resistor by the dummy wiring line (the overlapping parts).

A third aspect of the present invention is the first aspect of the present invention, wherein the insulating film includes side walls that cover respective side faces of the thin-film resistor.

With this configuration, moisture can be prevented from entering the sides of the thin-film resistor by the side walls, in a manner similar to the second aspect of the present invention. If the dummy wiring line has the overlapping parts as described above, then the overlapping parts and the thin-film resistor can be reliably insulated from each other.

A fourth aspect of the present invention is the first aspect of the present invention, further including: a second interlayer insulating film formed on the interlayer insulating film so as to cover the wiring line and the dummy wiring line, and wherein the second interlayer insulating film has a via hole formed therein selectively exposing a top of the dummy wiring line.

With this configuration, the thin-film resistor can be laser trimmed by emitting a laser through the via hole.

A fifth aspect of the present invention is the first aspect of the present invention, wherein the insulating film is an $SiO_2$ film, and wherein the semiconductor device further includes a TiN layer interposed between the dummy wiring line and the $SiO_2$ film.

With this configuration, a reaction between the dummy wiring line and $SiO_2$ film can be suppressed by interposing the TiN layer, which has relatively weak reducing characteristics, between the dummy wiring line and the $SiO_2$ film.

In order to have a favorable connection between the wiring line and the via below the wiring line, the surface of the wiring line in contact with the via may be formed with a Ti film with high reducing characteristics, for example. In such a case, if the dummy wiring line and the wiring line have exactly the same configuration, sometimes the Ti film of the dummy wiring line will react with the insulating film ($SiO_2$ film) between the thin-film resistor and the dummy wiring line to produce $TiO_2$, and this connects the thin-film resistor and the dummy wiring line via this $TiO_2$.

If the TiN layer is interposed between the dummy wiring line and the $SiO_2$ film as shown by the fifth aspect of the present invention, then a reaction between the dummy wiring line and the $SiO_2$ film can be suppressed; therefore, connection between the thin-film resistor and the dummy wiring line can be prevented.

In a sixth aspect of the present invention, the insulating film may be an $SiO_2$ film, and the interlayer insulating film may have, on an outermost surface thereof, an etching stopper made of an insulating material that has etching selectivity with respect to $SiO_2$. In such a case, the etching stopper may be made of an SiN film, as in a seventh aspect of the present invention.

In an eighth aspect of the present invention, the thin-film resistor may be made of SiCr, NiCr, TaN, or TiN. In a ninth aspect of the present invention, the dummy wiring line may be a multilayer configuration including an Al alloy wiring line and barrier films that respectively sandwich the Al alloy wiring line from above and below.

A tenth aspect of the present invention is the first aspect of the present invention, further including: a capacitor area disposed on the semiconductor substrate, wherein the capacitor area includes a bottom electrode disposed on the interlayer insulating film; a top electrode disposed in a wiring layer that is in the same layer as the wiring line, the top electrode facing the bottom electrode; and a capacitance film interposed between the bottom electrode and the top electrode.

With this configuration, an MIM (metal insulator metal) structure made of the bottom electrode, capacitance film, and top electrode can be formed in the same step as the thin-film resistor, insulating film, and dummy wiring line of the resistor area; therefore, the thin-film resister and MIM structure can be consolidated while preventing an increase in process steps in the manufacturing process.

An eleventh aspect of the present invention is the tenth aspect of the present invention, wherein the capacitance film is an $SiO_2$ film, and wherein the semiconductor device further includes a TiN layer interposed between the top electrode and the $SiO_2$ film.

With this configuration, a reaction between the top electrode and $SiO_2$ film can be suppressed by interposing the TiN layer between the top electrode and the $SiO_2$ film, and thus, a connection between the bottom electrode and top electrode can be prevented in a manner similar to the fifth aspect of the present invention.

A twelfth aspect of the present invention is the tenth aspect of the present invention, wherein the top electrode includes overlapping parts that overlap the bottom electrode from sides thereof.

With this configuration, moisture can be prevented from entering from the sides of the bottom electrode by the top electrode (overlapping parts).

A thirteenth aspect of the present invention is the tenth aspect of the present invention, wherein the capacitance film includes side walls that cover respective side faces of the bottom electrode.

With this configuration, moisture can be prevented from entering the sides of the bottom electrode by the side walls, in a manner similar to the twelfth aspect of the present invention. If the top electrode has the overlapping parts as described above, then the overlapping parts and the bottom electrode can be reliably insulated from each other.

A fifteenth aspect of the present invention is the fourteenth aspect of the present invention, wherein the step of forming the insulating film includes forming a base film completely covering the thin-film resistor on the interlayer insulating film and then forming the insulating film by selectively etching the base film such that parts of the surface of the interlayer insulating film on sides of the thin-film resistor are exposed, and wherein the step of forming the wiring line includes forming the dummy wiring line such that the dummy wiring line wraps around the sides of the thin-film resistor.

With this method, the semiconductor device of the second aspect of the present invention can be manufactured.

A sixteenth aspect of the present invention is the fourteenth aspect of the present invention, wherein the step of forming the insulating film includes forming a base film completely covering the thin-film resistor on the interlayer insulating film and then forming the insulating film by selectively etching the base film such that side walls covering respective side faces of the thin-film resistor remain.

With this method, the semiconductor device of the third aspect of the present invention can be manufactured.

A seventeenth aspect of the present invention is the fifteenth aspect of the present invention, wherein the step of forming the interlayer insulating film includes forming the interlaying insulating film such that an etching stopper is exposed on an outermost surface of the interlayer insulating film, the etching stopper being made of an insulating material having etching selectivity with respect to $SiO_2$, and wherein the step of forming the insulating film includes forming the insulating film of an $SiO_2$ film.

With this method, over-etching of the interlayer insulating film can be prevented when selectively etching the base film to form the insulating film. Due to this, the flatness of the interlayer insulating film can be ensured.

An eighteenth aspect of the present invention is the fourteenth aspect of the present invention, wherein the step of forming the insulating film includes forming the insulating film of an $SiO_2$ film, and wherein the method of manufacturing a semiconductor device further includes forming a TiN layer so as to cover the insulating film from above before forming the wiring line and the dummy wiring line.

With this method, the semiconductor device of the fifth aspect of the present invention can be manufactured.

A nineteenth aspect of the present invention is the fourteenth aspect of the present invention: wherein the semiconductor substrate has a capacitor area thereon, wherein, in the step of forming the thin-film resistor, a bottom electrode is formed on the interlayer insulating film in the capacitor area at the same time, wherein, in the step of forming the insulating film, a capacitance film that covers the bottom electrode is formed of the insulating film, and wherein, in the step of forming the wiring line, a top electrode that covers the bottom electrode from above through the capacitance film is formed.

With this method, the semiconductor device of the tenth aspect of the present invention can be manufactured.

A twentieth aspect of the present invention is the nineteenth aspect of the present invention, wherein the step of forming the insulating film includes forming the insulating film of an $SiO_2$ film, and wherein the method of manufacturing a semiconductor device further includes the step of forming a TiN layer so as to cover the capacitance film from above before forming the wiring line, the dummy wiring line, and the top electrode.

With this method, the semiconductor device of the eleventh aspect of the present invention can be manufactured.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Below, embodiments of the present invention will be explained in detail with reference to appended drawings.

Figure 1:
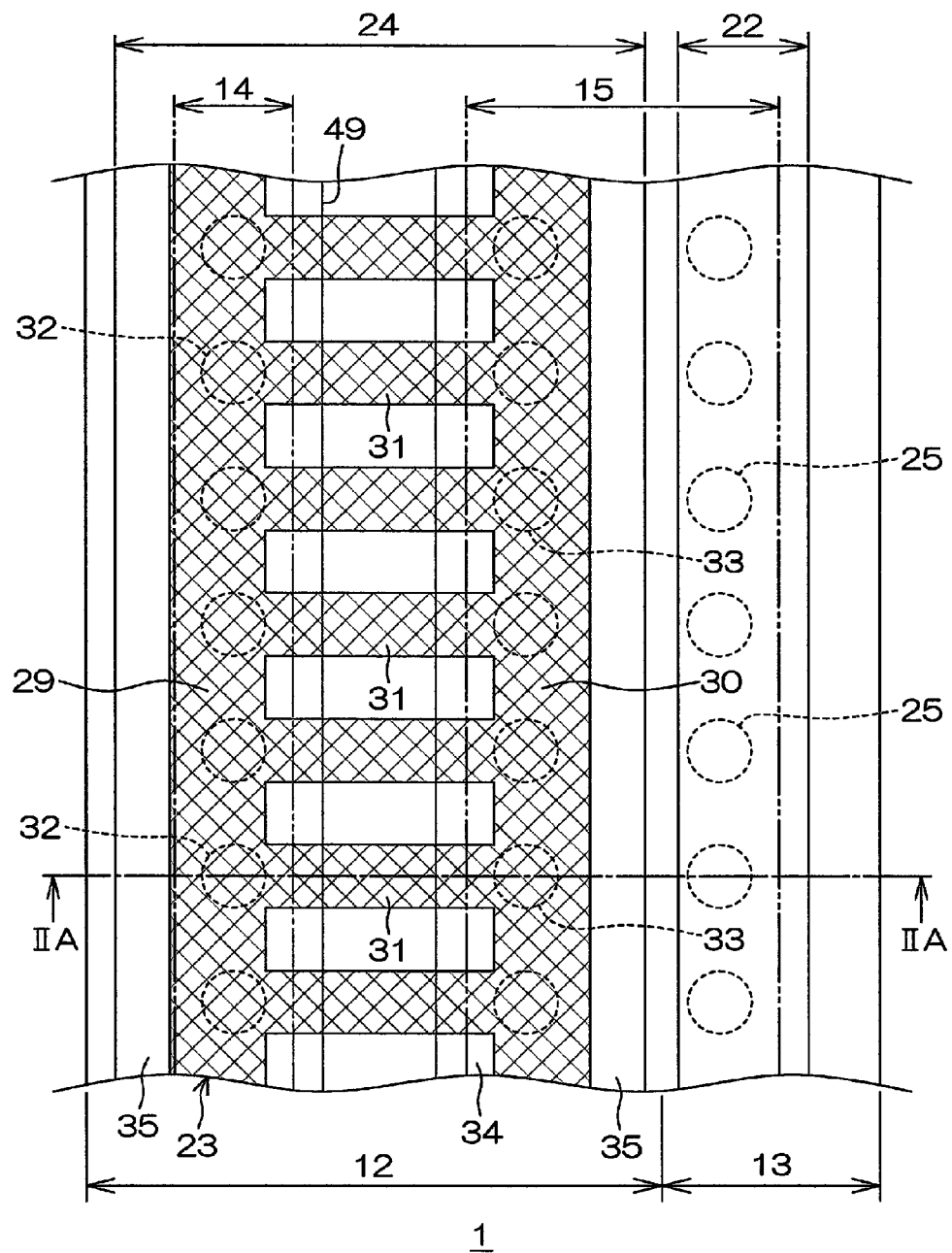
FIG. 1 is a plan view of a semiconductor device according to Embodiment 1 of the present invention.
Figure 2A:
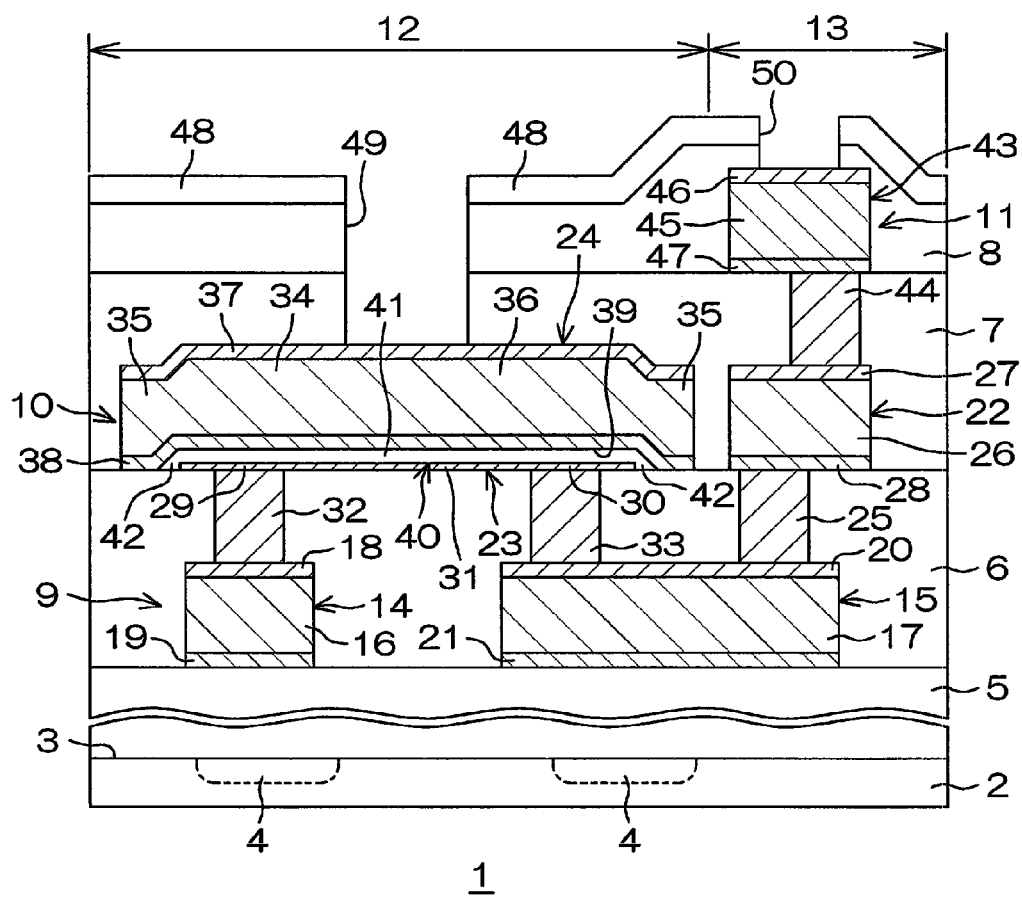
FIG. 2A is a cross-sectional view of FIG. 1 cut along IIA-IIA.
Figure 2B:
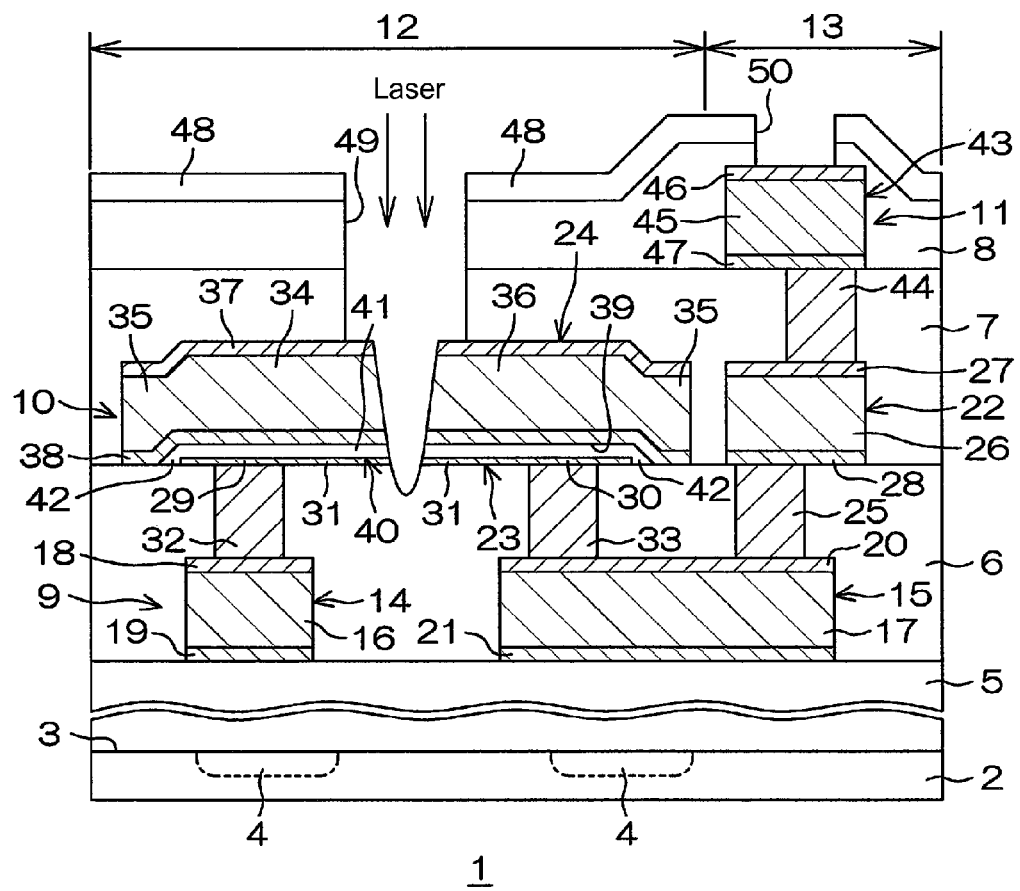
FIG. 2B is a view of the semiconductor device after laser trimming.

FIG. 1 is a plan view of a semiconductor device 1 according to Embodiment 1 of the present invention. FIG. 2A is a cross-sectional view of FIG. 1 cut along IIA-IIA. FIG. 2B is a view of the semiconductor device 1 after laser trimming.

The semiconductor device 1 includes a semiconductor substrate 2, and a plurality of interlayer insulating films 5 to 8 layered on this semiconductor substrate 2. The semiconductor substrate 2 is a silicon substrate in which semiconductor elements 4 such as active and passive elements are embedded in a surface 3 thereof, for example.

In the present embodiment, the plurality of interlayer insulating films 5 to 8 include, in order from the surface 3 of the semiconductor substrate 2: the first interlayer insulating film 5, the second interlayer insulating film 6 that is one example of a second interlayer insulating film of the present invention, the third interlayer insulating film 7 that is one example of an interlayer insulating film of the present invention, and the fourth interlayer insulating film 8. The respective interlayer insulating films 5 to 8 are made of a single-layer structure of a silicon oxide ($SiO_2$) film.

Wiring layers 9 to 11 are formed on the respective interlayer insulating films 5 to 8. In this embodiment, the second wiring layer 9 formed on the second interlayer insulating film 6, the third wiring layer 10 that is one example of a wiring layer of the present invention and formed on the third interlayer insulating film 7, and the fourth wiring layer 11 formed on the fourth interlayer insulating film 8 are shown in the drawings, but the wiring layer on top of the first interlayer insulating film 5 is not shown. The respective wiring layers 9 to 11 are each covered by the interlayer insulating film above.

"Wiring layer" refers to an aggregate of a plurality of wiring lines (conductive members) arranged on the same interlayer insulating film. The respective interlayer insulating films 5 to 8 and respective wiring layers 9 to 11 are labeled in order from the semiconductor substrate 2 side as "first," "second," etc.; however, when focusing on the second wiring layer 9 and third wiring layer 10 to define characteristics of the structure thereof, the second wiring layer 9 may be the first wiring layer, and the third wiring layer 10 may be the second wiring layer, for example.

In this embodiment, the area on the semiconductor substrate 2 where the interlayer insulating films 5 to 8 and wiring layers 9 to 11 are formed is selectively configured such that a resistor area 12 and a wiring area 13 are adjacent to each other.

In this embodiment, the second wiring layer 9 is formed on the surface of the first interlayer insulating film 5 and includes a pair of parallel wiring lines 14 and 15 with a gap therebetween. The second wiring layer 9 may include other wiring lines in the area on the second interlayer insulating film 6.

The wiring line 14 among the pair of wiring lines is arranged in the resistor area 12 in a straight line along the boundary of the resistor area 12 and the wiring area 13. The other wiring line 15 of the pair is formed wider than the wiring line 14 and is formed in a straight line on the above-mentioned boundary so as to straddle the resistor area 12 and the wiring area 13. The respective wiring lines 14 and 15 are electrically connected to the semiconductor elements 4 on the semiconductor substrate 2 by vias (not shown) formed in the first interlayer insulating film 5, for example. In this embodiment, the respective wiring lines 14 and 15 are made of a multilayer structure that includes Al alloy wiring lines 16 and 17 (Al—Cu alloy wiring lines, for example), and barrier films 18 to 21 that sandwich these Al alloy wiring lines 16 and 17 from above and below. The bottom barrier films 19 and 21 and top barrier films 18 and 20 are each made of TiN/Ti (TiN for the top layer, Ti for the bottom layer). These wiring lines 14 and 15 are covered by the second interlayer insulating film 6.

The third wiring layer 10 includes a wiring line 22, thin-film resistor 23, and dummy wiring line 24.

The wiring line 22 is placed in the wiring area 13 and is formed in a straight line on the surface of the second interlayer insulating film 6, the straight line going along an area above the wiring line 15 of the second wiring layer 9. Due to this, the wiring line 22 and the wiring line 15 face each other in the thickness direction of the second interlayer insulating film 6. The wiring line 22 is electrically connected to the wiring line 15 by a via 25 (a tungsten (W) via, for example) formed in the second interlayer insulating film 6. In this embodiment, a plurality of the vias 25 are provided with equal gaps therebetween along the lengthwise direction of the wiring line 22. In this embodiment, the wiring line 22 is made of a multilayer structure including an Al alloy wiring line 26 (an Al—Cu alloy wiring line, for example), and barrier films 27 and 28 that sandwich this Al alloy wiring line 26 from above and below, in a manner similar to the wiring lines 14 and 15. The bottom barrier film 28 and top barrier film 27 are each made of TiN/Ti (TiN for the top layer, Ti for the bottom layer).

The thin-film resistor 23 is made of a metal thin-film that is approximately 5 nm to 20 nm and is arranged on the surface of the second interlayer insulating film 6 in the resistor area 12, for example. The material of the thin-film resistor 23 can be SiCr, NiCr, TaN, TiN, or the like, for example, and TaN is used in the present embodiment. The thin-film resistor 23 is formed in a straight line along the boundary of the resistor area 12 and the wiring area 13. As shown in FIG. 1, in a plan view seen from a direction normal to the surface of the second interlayer insulating film 6, the thin-film resistor 23 is arranged so as to straddle the wiring lines 14 and 15 below.

Specifically, the thin-film resistor 23 is formed in a ladder-like pattern and integrally includes a pair of contact parts 29 and 30 with gaps therebetween arranged facing the respective wiring lines 14 and 15 in the thickness direction of the second interlayer insulating film 6, and a plurality of fuses 31 arranged so as to intersect the pair of contact parts 29 and 30.

The pair of contact parts 29 and 30 is formed on both widthwise ends (on one end and the other end) of the thin-film resistor 23. Among the contact parts, the contact part 29 facing the wiring line 14 of the second wiring layer 9 is electrically connected to the wiring line 14 by a via 32 (a tungsten (W) via, for example) formed in the second interlayer insulating film 6. The other contact part 30 facing the other wiring line 15 of the second wiring layer 9 is electrically connected to the wiring line 15 by a via 33 (a tungsten (W) via, for example) formed in the second interlayer insulating film 6. In this embodiment, a plurality of the vias 32 and 33 are provided with equal gaps therebetween along the lengthwise direction of the contact parts 29 and 30. Due to this, the thin-film resistor 23 is electrically connected to the wiring line 22 of the third wiring layer 10 in the same layer via the second wiring layer 9 (specifically, the wiring line 15) below the third wiring layer 10, which is where the thin-film resistor 23 is arranged.

In this embodiment, the plurality of fuses 31 are provided along the lengthwise direction of the thin-film resistor 23 with equal gaps therebetween. The respective fuses 31 are formed in a straight line along the widthwise direction of the thin-film resistor 23 and are arranged so as to link the connecting parts of the vias 32 and 33 that face each other in the widthwise direction. The respective fuses 31 are connected to inside the contact parts 29 and 30 such that both ends of the respective fuses 31 do not protrude outside of the contact parts 29 and 30. The respective fuses 31 are formed so as to be able to be cut (fused) by a laser. In this way, by cutting the unnecessary portions of the plurality of fuses 31, it is possible to electrically separate the respective fuses 31 from the contact parts 29 and 30.

The dummy wiring line 24 is formed in a straight line with the area of the dummy wiring line above the thin-film resistor 23 in the resistor area 12 being along the thin-film resistor 23. This dummy wiring line 24 integrally includes a facing part 34 that is arranged above the thin-film resistor 23 and faces the thin-film resistor 23 in the thickness direction of the second interlayer insulating film 6 with a gap therebetween, and overlapping parts 35 that extend from the facing part 34 to respective sides of the thin-film resistor 23 and that face the thin-film resistor 23 with a gap therebetween in the direction along the surface of the second interlayer insulating film 6. Due to this, in a cross-sectional view along the widthwise direction of the dummy wiring line 24, the dummy wiring line 24 is formed in an arch-like shape that covers the thin-film resistor 23 from above and from the sides. In this embodiment, the dummy wiring line 24 has the same configuration as the wiring line 22. In other words, the dummy wiring line 24 is made of a multilayer structure that includes an Al alloy wiring line 36 (an Al—Cu alloy wiring line, for example), and barrier films 37 and 38 that sandwich the Al alloy wiring line 36 from above and below. The bottom barrier film 38 and top barrier film 37 are each made of TiN/Ti (TiN for the top layer, Ti for the bottom layer).

The overlapping parts 35 are formed so as to contact the surface of the second interlayer insulating film 6 on both sides of the thin-film resistor 23 in the widthwise direction. More specifically, the bottom of the bottommost film (the bottom barrier film 38) of the wiring film of the multilayer structure constituting the dummy wiring line 24 is in contact with the surface of the second interlayer insulating film 6. The Al alloy wiring line 36 and top barrier film 37, which are the other parts of this film, are layered in the direction normal to the surface of the second interlayer insulating film 6. Forming the overlapping parts 35 makes it possible to prevent moisture entering from the sides of the thin-film resistor 23. In this embodiment, the boundary between the overlapping parts 35 and the second interlayer insulating film 6 is only constituted of the rear surface of the bottom barrier film 38; there is no multilayer boundary of a multilayer structure constituting the dummy wiring line 24 at this boundary. Therefore, even if moisture enters the multilayer boundary, the moisture can be prevented from entering the thin-film resistor 23.

A closed area 39 defined by the arch-shaped dummy wiring line 24 is demarcated around the thin-film resistor 23. As shown in FIGS. 1 and 2A, the portion of the overlapping part 35 on the side far from the wiring line 22 may extend outwards more than the wiring line 14 below and not face the wiring line 14 in the thickness direction of the second interlayer insulating film 6.

An insulating film 40 is disposed in the closed area 39 between the thin-film resistor 23 and the dummy wiring line 24. The insulating film 40 is a silicon oxide ($SiO_2$) film with a thickness of approximately 20 nm, for example. The insulating film 40 is not limited to $SiO_2$, and conventional materials for a so-called interlayer insulating film can be used. The insulating film 40 may be a low-κ film (a low-permittivity film) such as SiOC or SiOF. A low-κ film can reduce the effects of parasitic capacitance.

This insulating film 40 integrally includes a plane part 41 that is interposed between the facing part 34 of the dummy wiring line 24 and the thin-film resistor 23 and that covers the top of the thin-film resistor 23, and side walls 42 that are between the overlapping parts 35 of the dummy wiring line 24 and the thin-film resistor 23 and that cover the side faces of the thin-film resistor 23. Forming the side walls 42 allows formation of double-structured wall parts on the sides of the thin-film resistor 23 with the overlapping parts 35 of the dummy wiring line 24, and these wall parts can reliably prevent moisture entering from the sides of the thin-film resistor 23. These side walls 42 can insulate the overlapping parts 35 of the dummy wiring line 24 from the thin-film resistor 23.

The wiring line 22, thin-film resistor 23, and dummy wiring line 24 are covered by the third interlayer insulating film 7.

In this embodiment, the fourth wiring layer 11 includes a wiring line 43 formed on the surface of the third interlayer insulating film 7. The fourth wiring layer 11 may include other wiring lines in the area on the third interlayer insulating film 7.

The wiring line 43 is arranged in the wiring area 13 and formed in a straight line that goes along the wiring line 22 in an area above the wiring line 22 of the third wiring layer 10. Due to this, the wiring line 43 and the wiring line 22 face each other in the thickness direction of the third interlayer insulating film 7. The wiring line 43 is electrically connected to the wiring line 22 by a via 44 (a tungsten (W) via, for example) formed in the third interlayer insulating film 7. In this embodiment, the wiring line 43 is made of a multilayer structure including an Al alloy wiring line 45 (an Al—Cu alloy wiring line, for example), and barrier films 46 and 47 that sandwich this Al alloy wiring line 45 from above and below, in a manner similar to the wiring line 22. The bottom barrier film 47 and top barrier film 46 are each made of TiN/Ti (TiN for the top layer, Ti for the bottom layer).

This wiring line 43 is covered by the fourth interlayer insulating film 8. A passivation film 48 made of silicon nitride (SiN), for example, is formed on the fourth interlayer insulating film 8.

A fuse window 49, which is one example of a via hole of the present invention, is formed from the surface the passivation film 48, through the passivation film 48 and third and fourth interlayer insulating films 7 and 8 such that the top of the dummy wiring line 24 is selectively exposed. As shown in FIG. 1, the fuse window 49 is formed in a straight line along the lengthwise direction of the thin-film resistor 23. As shown in FIG. 2B, once the resistance of the thin-film resistor 23 has been determined, a desired resistance can then be achieved if one or a plurality of appropriately selected fuses 41 among the plurality of fuses 41 are cut with a laser (laser trimmed) radiated via the fuse window 49 to the dummy wiring line 29, in accordance with the desired resistance.

A pad opening 50 is formed from the surface of the passivation film 48 through the passivation film 48 and fourth interlayer insulating film 8 such that a portion of the wiring line 43 is selectively exposed as the pad.

FIGS. 3A to 3K are cross-sectional views of one example of the manufacturing steps of the semiconductor device 1 in FIG. 2A. The semiconductor substrate 2 is omitted in FIGS. 3A to 3K.

Figure 3A:
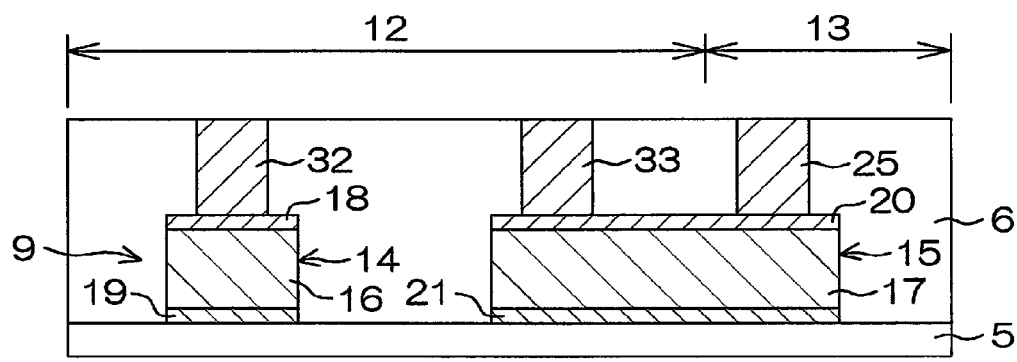
FIG. 3A is a cross-sectional view showing an example of a manufacturing step of the semiconductor device in FIG. 2A.

As shown in FIG. 3A, when manufacturing the semiconductor device 1, the first interlayer insulating film 5 is formed on the semiconductor substrate 2 by CVD, for example, after the semiconductor elements 4 have been embedded in the surface 3 of the semiconductor substrate 2 (refer to FIG. 2A for the semiconductor substrate 2 and the like). Next, via holes (not shown) that selectively expose the semiconductor elements 4 are formed in the first interlayer insulating film 5 by dry etching, for example, and then vias (not shown) made of tungsten (W) are respectively formed in these via holes.

Next, as shown in FIG. 3A, the TiN/Ti material for the bottom barrier films 19 and 21, the material for the Al alloy wiring lines 16 and 17, and the TiN/Ti material for the top barrier films 18 and 20 are deposited in succession on the surface of the first interlayer insulating film 5 by sputtering, for example. Next, a resist film (not shown) that selectively covers the areas where the wiring lines 14 and 15 will be formed is formed on these deposited materials, and these deposited materials are dry etched through the resist film. This simultaneously forms the wiring lines 14 and 15 and completes the forming of the second wiring layer 9.

Next, as shown in FIG. 3A, the second interlayer insulating film 6 is layered onto the first interlayer insulating film 5 by CVD, for example, so as to cover the second wiring layer 9. Next, as shown in FIG. 3A, the via holes selectively exposing the wiring lines 14 and 15 are formed in the second interlayer insulating film 6 by dry etching, for example, and then the vias 25, 32, and 33 made of tungsten (W) are formed simultaneously in these via holes. The vias 25, 32, and 33 are formed in the respective via holes by the tungsten film being planarized by etch back or CMP after this tungsten film is supplied to the via holes by CVD, for example. Accordingly, the vias 25, 32, and 33 are selectively exposed on the surface of the second interlayer insulating film 6.

Figure 3B:
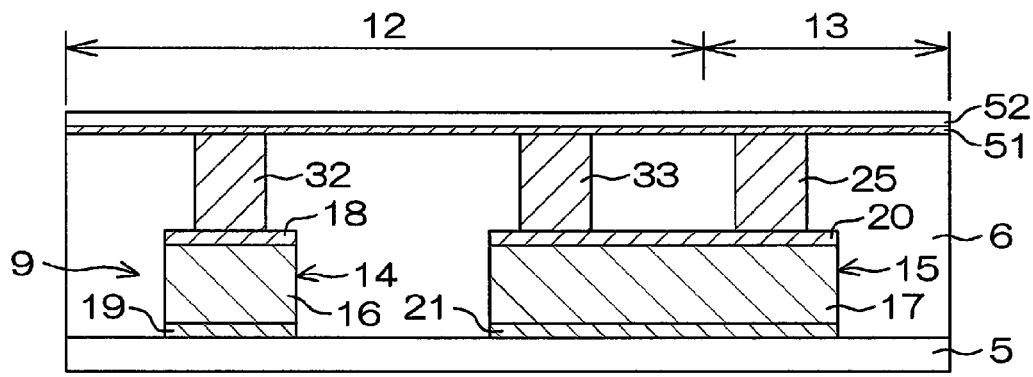
FIG. 3B is a view showing the next manufacturing step after FIG. 3A.

Next, as shown in FIG. 3B, a metal thin-film 51 (TaN in this embodiment), which is the material of the thin-film resistor 23, is layered onto the second interlayer insulating film 6 by sputtering, for example, so as to contact the vias 25, 32, and 33 exposed from the surface of the second interlayer insulating film 6. After the metal thin-film 51 is layered thereon, a first base film 52 made of silicon oxide ($SiO_2$), which acts as the base for the insulating film 40, is layered onto the metal thin-film 51 by CVD, for example. The metal thin-film 51 has a thickness of 5 nm to 20 nm, for example, and the first base film 52 has a thickness of approximately 20 nm, for example.

Figure 3C:
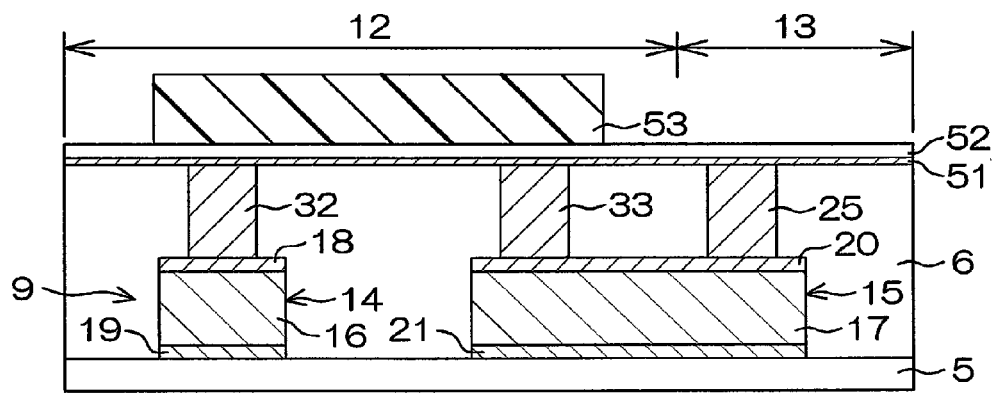
FIG. 3C is a view showing the next manufacturing step after FIG. 3B.

Next, as shown in FIG. 3C, a resist film 53 that selectively covers the area where the thin-film resistor 23 will be formed is formed on the first base film 52.

Figure 3D:
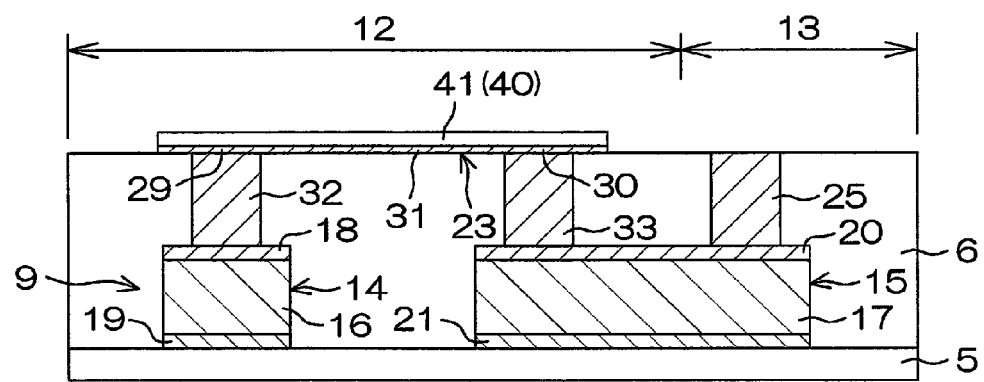
FIG. 3D is a view showing the next manufacturing step after FIG. 3C.

Next, as shown in FIG. 3D, the first base film 52 and metal thin-film 51 are successively dry etched through the resist film 53. This removes unnecessary portions of the metal thin-film 51 and forms the thin-film resistor 23. The plane part 41 of the insulating film 40, which covers the top of the thin-film resistor 23 and exposes the side faces of the thin-film resistor 23, is simultaneously formed on the thin-film resistor 23. Thereafter, the resist film 53 is removed by ashing, for example.

Figure 3E:
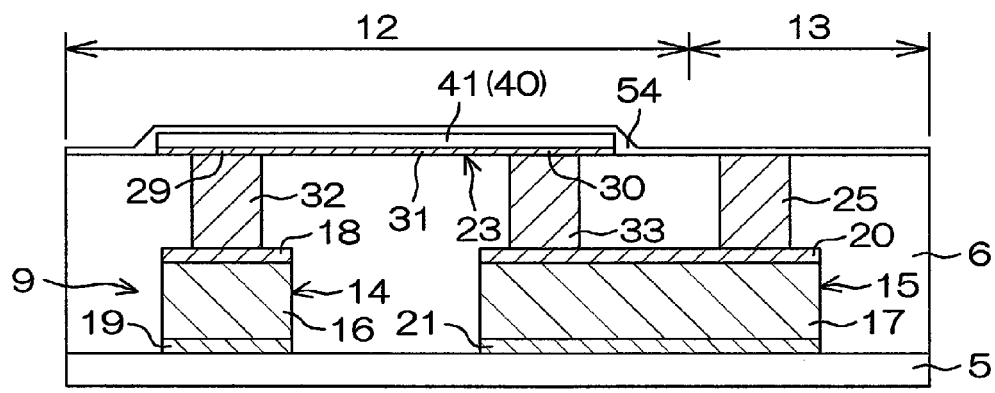
FIG. 3E is a view showing the next manufacturing step after FIG. 3D.

Next, as shown in FIG. 3E, a silicon oxide ($SiO_2$) film with a thickness of approximately 20 nm is layered by CVD, for example, onto the second interlayer insulating film 6 so as to cover the plane part 41. This silicon oxide film is a second base film 54, which is one example of a base film of the present invention, and completely covers the exposed side faces of the thin-film resistor 23.

Figure 3F:
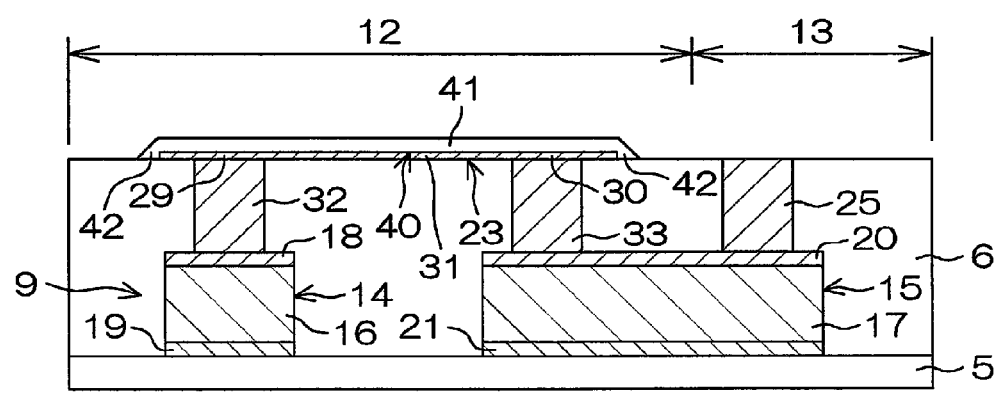
FIG. 3F is a view showing the next manufacturing step after FIG. 3E.

Next, as shown in FIG. 3F, the second base film 54 is removed successively from the top by etch back, for example. The etch back is performed until the top of the via 25 is exposed on the surface of the second interlayer insulating film 6, for example. This removes all portions of the second base film 54 except those portions that will act as the side walls 42, and selectively exposes the via 25 on the surface of the second interlayer insulating film 6. The remaining portions of the second base film 54 form the side walls 42. This forms the insulating film 40.

Figure 3G:
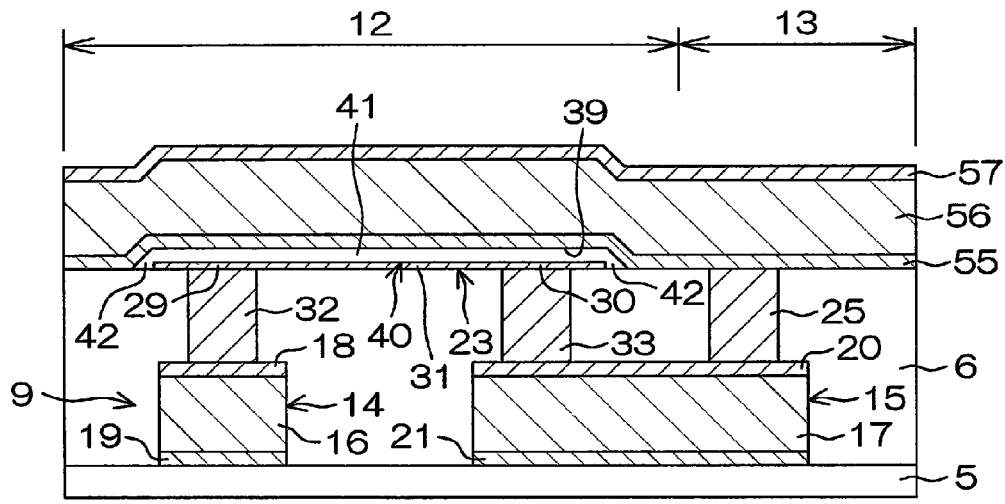
FIG. 3G is a view showing the next manufacturing step after FIG. 3F.

Next, as shown in FIG. 3G, a TiN/Ti material 55 of the bottom barrier films 28 and 38, an Al alloy material 56 of the Al alloy wiring lines 26 and 36, and a TiN/Ti material 57 of the top barrier films 27 and 37 are deposited in succession by sputtering, for example, onto the surface of the second interlayer insulating film 6 so as to completely cover the insulating film 40.

Figure 3H:
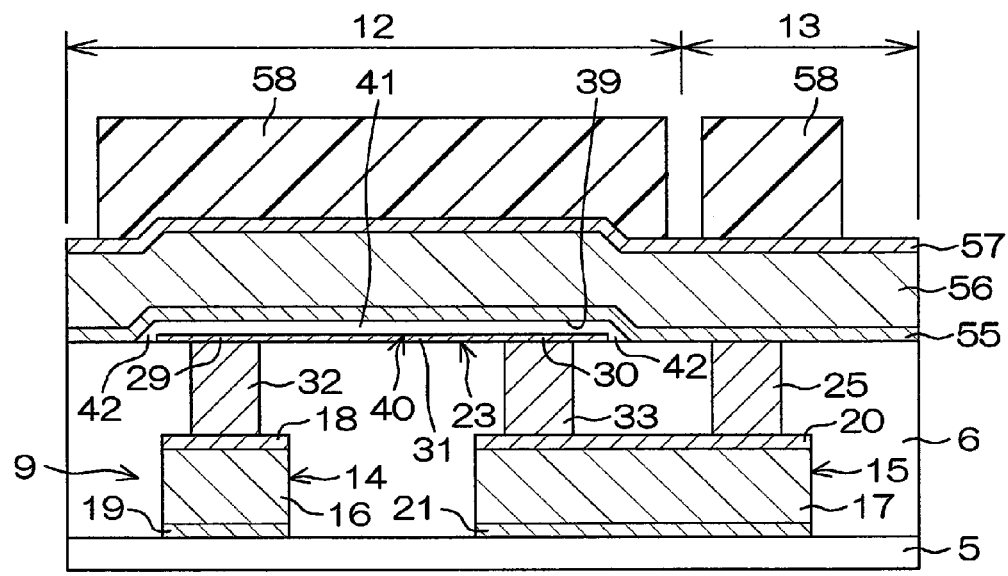
FIG. 3H is a view showing the next manufacturing step after FIG. 3G.

Next, as shown in FIG. 3H, resist films 58 that selectively cover areas where the wiring line 22 and the dummy wiring line 24 will be formed are formed on the TiN/Ti material 57.

Figure 3I:
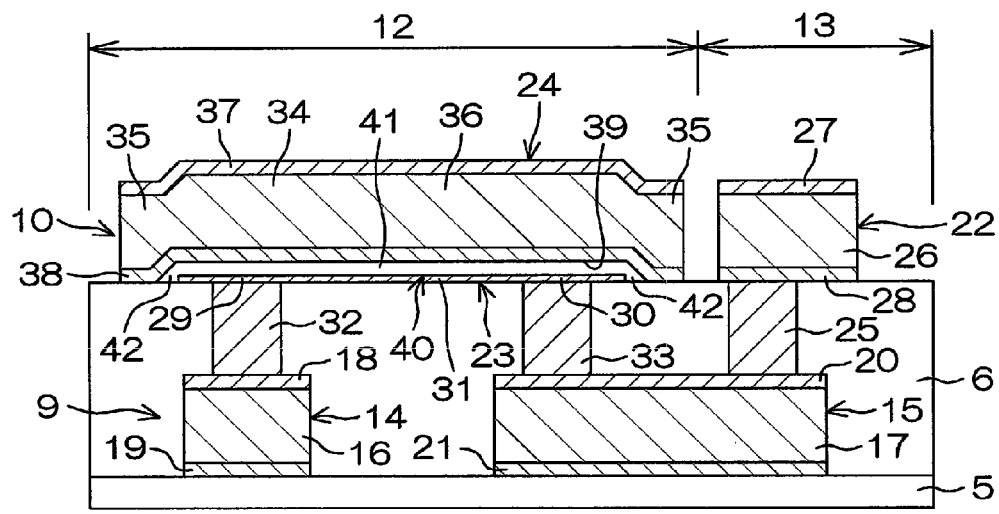
FIG. 3I is a view showing the next manufacturing step after FIG. 3H.

Next, as shown in FIG. 3I, the TiN/Ti material 57, Al alloy material 56, and TiN/Ti material 55 are successively dry etched through the resist film 58. This simultaneously forms the wiring line 22 and dummy wiring line 24 and completes the forming of the third wiring layer 10.

Figure 3J:
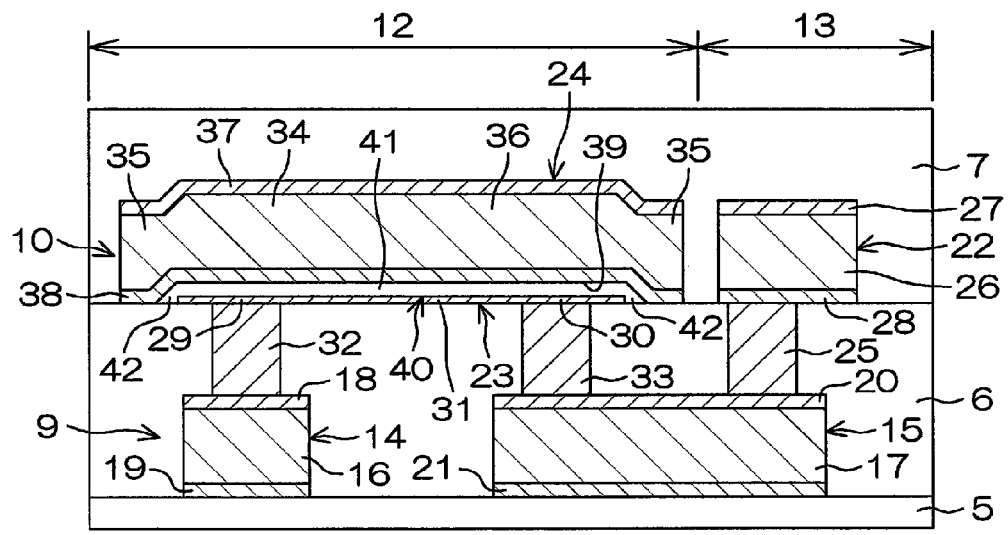
FIG. 3J is a view showing the next manufacturing step after FIG. 3I.

Next, as shown in FIG. 3J, the third interlayer insulating film 7 is layered onto the second interlayer insulating film 6 by CVD, for example, so as to cover the third wiring layer 10.

Figure 3K:
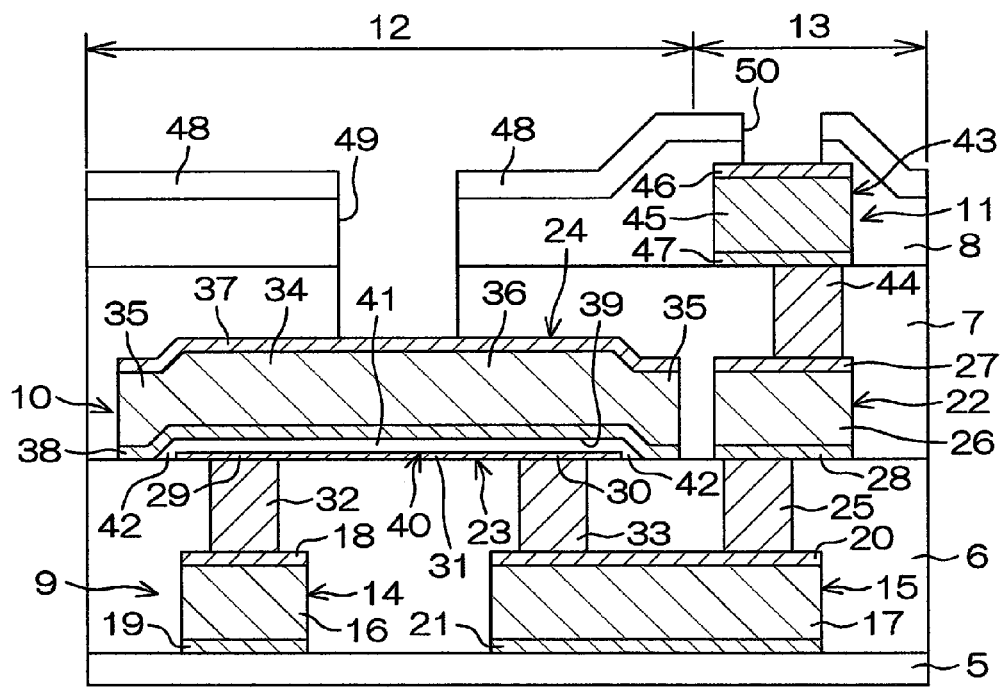
FIG. 3K is a view showing the next manufacturing step after FIG. 3J.

Next, as shown in FIG. 3K, the via hole selectively exposing the wiring line 22 is formed in the third interlayer insulating film 7 by dry etching, for example, and then the via 44 made of tungsten (W) is formed in this via hole. The via 44 is formed in the respective via hole by the tungsten film being planarized by etch back or CMP after this tungsten film is deposited to the via hole by CVD, for example. Accordingly, the via 44 is selectively exposed on the surface of the third interlayer insulating film 7.

Next, as shown in FIG. 3K, the TiN/Ti material for the bottom barrier film 47, the material for the Al alloy wiring line 45, and the TiN/Ti material for the top barrier film 46 are deposited in succession onto the surface of the third interlayer insulating film 7 by sputtering, for example. Next, a resist film (not shown) that selectively covers the area where the wiring line 43 will be formed is formed on these deposited materials, and these deposited materials are dry etched through the resist film. This forms the wiring line 43 and completes the forming of the fourth wiring layer 11.

Next, as shown in FIG. 3K, after the fourth interlayer insulating film 8 is layered onto the third interlayer insulating film 7 so as to cover the third wiring layer 10, and the passivation film 48 is layered onto the fourth interlayer insulating film 8 by CVD, for example. After the passivation film 48 is formed, a resist film (not shown) with openings where the fuse window 49 and pad opening 50 will be formed is formed onto the passivation film 48. The fuse window 49 and pad opening 50 are formed at the same time by dry etching the passivation film 48 and the like through this resist film. Thereafter, as described above, laser trimming is performed to achieve a desired resistance by emitting a laser through the fuse window 49. The semiconductor device 1 as shown in FIG. 2A is obtained by the steps above.

As described above, in this method, the thin-film resistor 23 is formed before the wiring line 22 (FIGS. 3B to 3D) in the third wiring layer 10 where the thin-film resistor 23 is arranged, and after that the wiring line 22 is formed (FIGS. 3G to 3I). In this way, the thin-film resistor 23 and wiring line 22 are formed in different steps; therefore, the TiN/Ti material 55, which is preferable as the contact material with the tungsten via 25, can be used for the bottom of the wiring line 22, and the metal thin-film 51 made of TaN, which is preferable for resistance, can be used for the thin-film resistor 23. This prevents an increase in contact resistance between the wiring line 22 and the via 25.

The thin-film resistor 23 is protected by the dummy wiring line 24 arranged in the third wiring layer 10, which is the same layer as the wiring line 22; thus, etching damage to the thin-film resistor 23 can be prevented during patterning (dry etching) of the wiring line 22 shown in FIG. 3I. In the step shown in FIG. 3K, the dry etching can be stopped by the dummy wiring line 24 while the fuse window 49 is being formed above the thin-film resistor 23, and therefore, damage caused by this dry etching can be prevented. If the portion exposed to the fuse window 49 is a metal such as the material the dummy wiring line 24 is made of, then the laser trimming thereafter (see FIG. 2B) can be performed with more stability than if an insulating material were being exposed.

The contact for the thin-film resistor 23 is formed using the vias 32 and 33 in the second wiring layer 9 in the layer below the thin-film resistor 23. Therefore, the etching mask for these via holes can be shared while forming the via 25 that contacts the wiring line 22 from below in the second interlayer insulating film 6. Accordingly, it is possible to suppress degradation in efficiency of the manufacturing process and an increase in cost.

Furthermore, the resistor area 12 and the wiring area 13 are separate, and there is no wiring line between the thin-film resistor 23 and the second interlayer insulating film 6; therefore, the flatness of the thin-film resistor 23 can be ensured. Due to this, differences in resistance of the thin-film resistor 23 can be eliminated or reduced.

Figure 4:
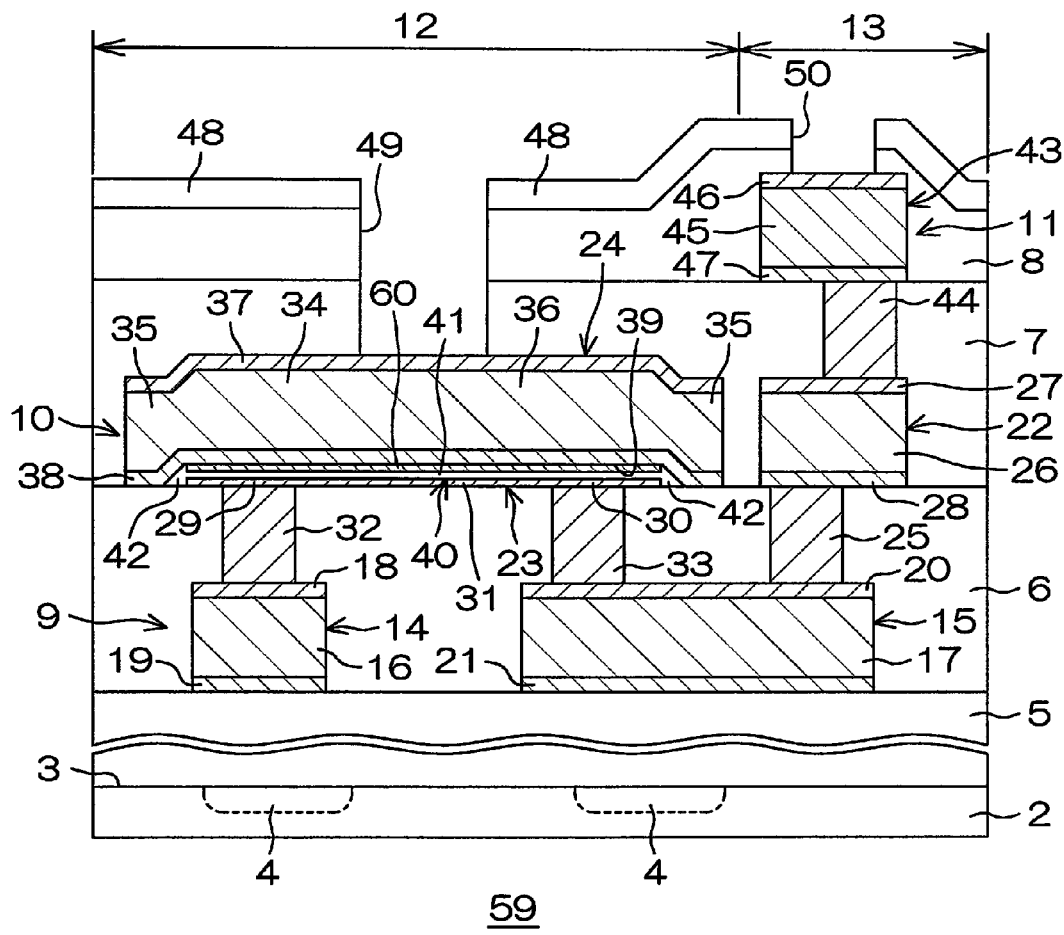
FIG. 4 is a cross-sectional view of a semiconductor device according to Embodiment 2 of the present invention.

FIG. 4 is a cross-sectional view of a semiconductor device 59 according to Embodiment 2 of the present invention. In FIG. 4, portions corresponding to the portions in FIG. 2A are assigned the same reference characters.

This semiconductor device 59 further includes a TiN layer 60 between a dummy wiring line 24 and an insulating film 40, in addition to the configuration of the semiconductor device 1 described above. In a plan view, the TiN layer 60 is formed in a thin-film shape having the same outer shape as a thin-film resistor 23. In other words, in FIG. 1, the TiN layer 60 has a shape in which the areas between adjacent fuses 31 of the ladder-like thin-film resistor 23 are also formed in a film-like shape. This TiN layer 60 faces the thin-film resistor 23 across the plane part 41 of the insulating film 40.

Figure 5A:
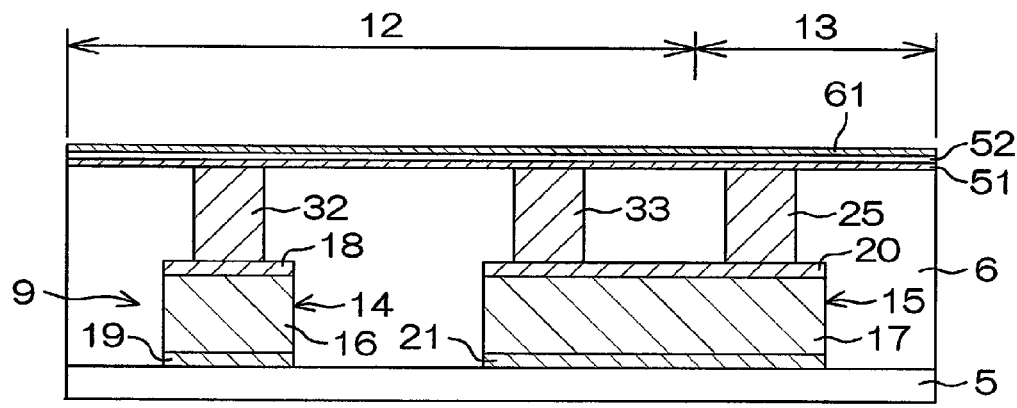
FIG. 5A is a cross-sectional view showing an example of a manufacturing step of the semiconductor device in FIG. 4.
Figure 5B:
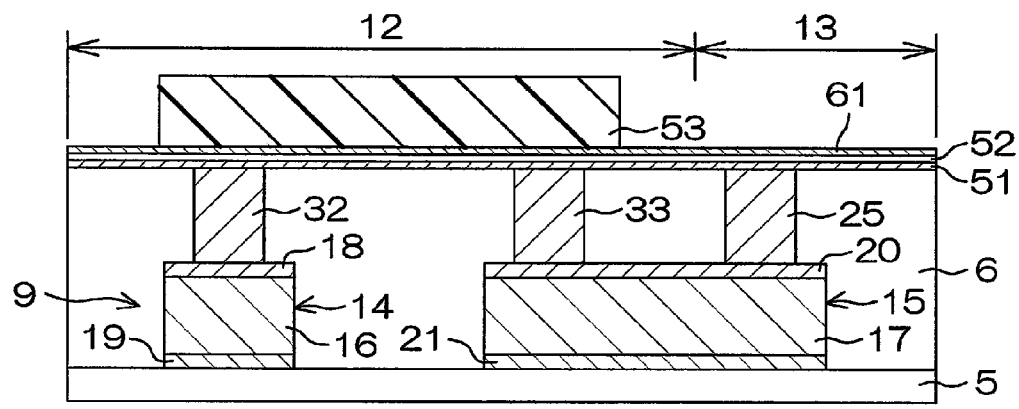
FIG. 5B is a view showing the next manufacturing step after FIG. 5A.
Figure 5C:
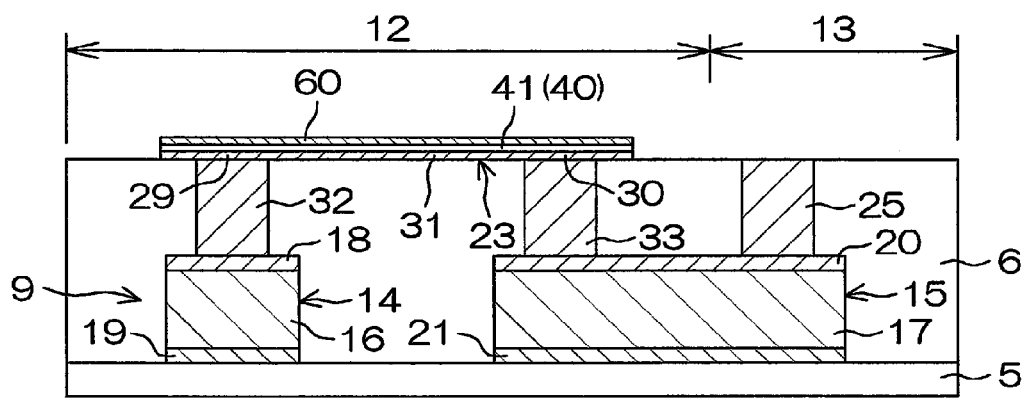
FIG. 5C is a view showing the next manufacturing step after FIG. 5B.

The manufacturing steps of the semiconductor device 59 of this embodiment are substantially similar to the steps shown in FIGS. 3A to 3K. However, in the step in FIG. 3B, a TiN material 61 is layered onto a first base film 52 by sputtering, for example, after the first base film 52 has been formed, as shown in FIG. 5A. Then, as shown in FIG. 5B, after a resist film 53 has been formed on the TiN material 61, the TiN material 61, first base film 52, and a metal thin-film 51 are successively dry etched through the resist film 53, as shown in FIG. 5C. In this way, the TiN layer 60 having the same outer shape as the thin-film resistor 23 is formed.

Thereafter, as in the step shown in FIG. 3E, a silicon oxide ($SiO_2$) film with a thickness of approximately 20 nm is layered by CVD, for example, in order to completely cover the thin-film resistor 23 and TiN layer 60 with a second base film 54. Next, as in the step shown in FIG. 3F, the second base film 54 is removed successively from the top by etch back, for example. The etch back is performed until the top of the TiN 60 layer is exposed, for example, and side walls 42 are formed so as to cover the side faces of the thin-film resistor 23 and the side faces of the TiN layer 60. Due to this, the TiN layer 60 has a shape in which the layer is formed in the side walls 42. Accordingly, even if the TiN layer 60 is interposed between the dummy wiring line 24 and insulating film 40 as in this semiconductor device 59, an increase in the level difference of the thickness of the added TiN layer 60 can be suppressed.

With this semiconductor device 59, the reaction between the dummy wiring line 24 and insulating film 40 can be suppressed by the TiN layer 60 that has relatively weak reducing characteristics being present between the dummy wiring line 24 and insulating film 40 (the $SiO_2$ film).

In the embodiment described above and this embodiment, in order to have a good connection between the wiring line 22 and via 25, the surface (the bottom) of the wiring line 22 in contact with the via 25 is a Ti film (barrier film 28 bottom layer), which has high reducing characteristics. However, because the dummy wiring line 24 and the wiring line 22 have the exact same structure, the Ti film of the barrier film 38 of the dummy wiring line 24 sometimes reacts with the insulating film 40 between the thin-film resistor 23 and the barrier film 38 to produce $TiO_2$, and the thin-film resistor 23 and dummy wiring line 24 are connected through this $TiO_2$.

If the TiN layer 60 is interposed between the dummy wiring line 24 and insulating film 40 as in Embodiment 2, connection between the thin-film resistor 23 and dummy wiring line 24 can be prevented because the reaction between the dummy wiring line 24 and insulating film 40 is able to be suppressed.

Needless to say, effects similar to Embodiment 1 can also be achieved with this semiconductor device 59.

Figure 6:
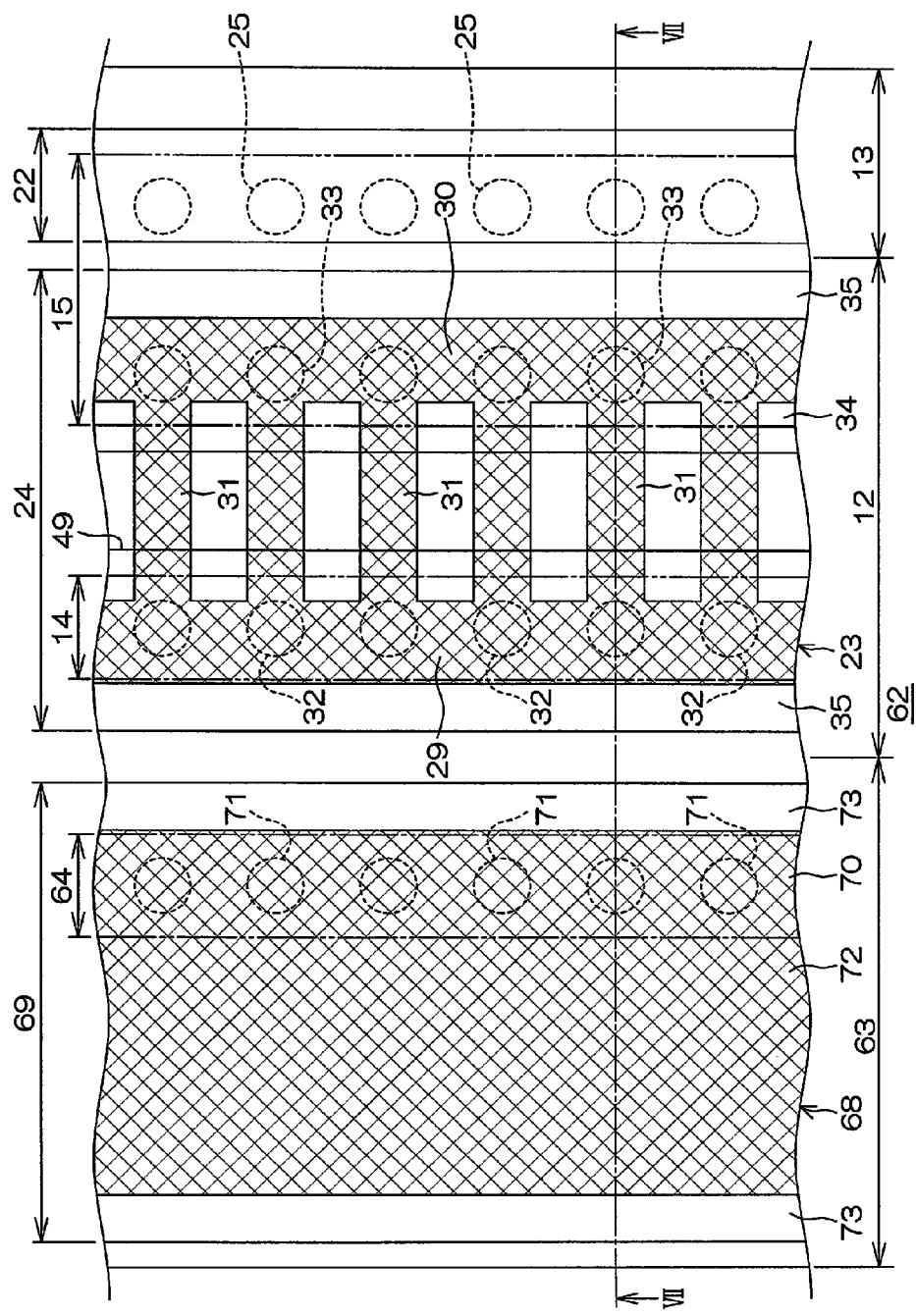
FIG. 6 is a plan view of a semiconductor device according to Embodiment 3 of the present invention.
Figure 7:
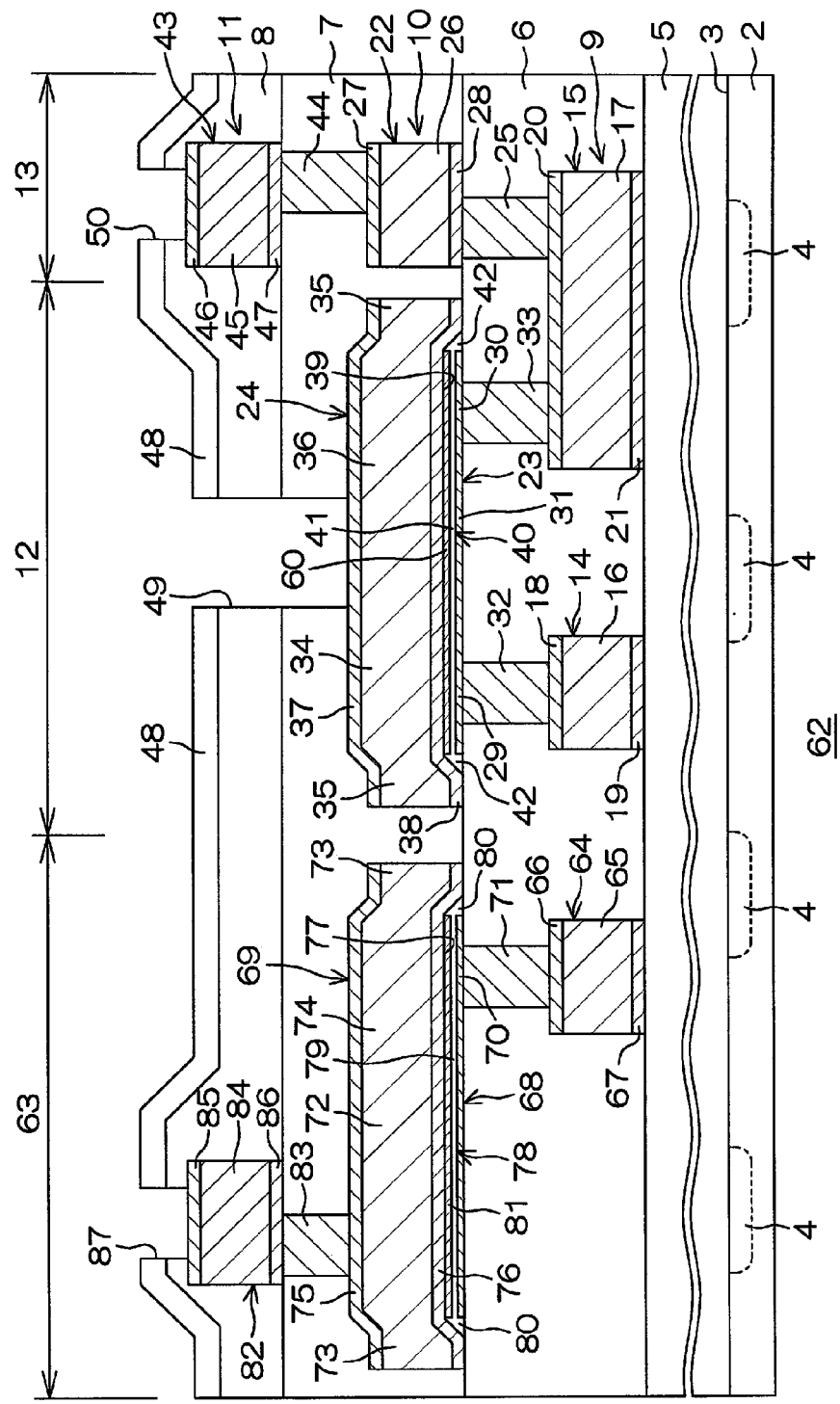
FIG. 7 is a cross-sectional view of FIG. 6 cut along VII-VII.

FIG. 6 is a plan view of a semiconductor device 62 according to Embodiment 3 of the present invention. FIG. 7 is a cross-sectional view of FIG. 6 cut along VII-VII. In FIGS. 6 and 7, portions corresponding to the portions in FIGS. 1, 2A, and 4 are assigned the same reference characters.

This semiconductor device 62 further includes a capacitor area 63 on an area on a semiconductor substrate 2, in addition to the above-mentioned configuration of the semiconductor devices 1 and 59. The capacitor area 63 is selectively configured so as to be adjacent to a side of a resistor area 12 that is opposite to a wiring area 13.

In the capacitor area 63, a second wiring layer 9 includes a wiring line 64. The wiring line 64 is formed with approximately the same width as a wiring line 14 in the resistor area 12, and this wiring line 64 is parallel to the wiring line 14 along the boundary of the resistor area 12 and capacitor area 63. The wiring line 64 is electrically connected to semiconductor elements 4 on the semiconductor substrate 2 by vias (not shown) formed in a first interlayer insulating film 5, for example. In this embodiment, the wiring line 64 is made of a multilayer structure including an Al alloy wiring line 65 (an Al—Cu alloy wiring line, for example), and barrier films 66 and 67 that sandwich this Al alloy wiring line 65 from above and below. The bottom barrier film 67 and top barrier film 66 are each made of TiN/Ti (TiN for the top layer, Ti for the bottom layer).

In the capacitor area 63, the third wiring layer 10 includes a bottom electrode 68 and a top electrode 69.

The bottom electrode 68 is a metal thin-film that is approximately 5 nm to 20 nm, for example, and disposed on the surface of a second interlayer insulating film 6 in the capacitor area 63. The material of the bottom electrode 68 is the same material as the thin-film resistor 23, and in this embodiment SiCr, NiCr, TaN, TiN, or the like can be used, but TaN is used in this embodiment. The bottom electrode 68 is formed in a straight line along the boundary of the resistor area 12 and the capacitor area 63. As shown in FIG. 6, the bottom electrode 68 is disposed so as to cover the wiring line 64 in the layer below in a plan view seen from a direction normal to the surface of the second interlayer insulating film 6.

Specifically, the bottom electrode 68 has a contact part 70 that faces the wiring line 64 in the thickness direction of the second interlayer insulating film 6. In this embodiment, among both ends of the bottom electrode 68 in the widthwise direction, the contact part 70 is disposed on the end of the bottom electrode 68 that is near the resistor area 12. This contact part 70 is electrically connected with the wiring line 64 by a via 71 (a tungsten (W) via, for example) in the second interlayer insulating film 6. In this embodiment, a plurality of the vias 71 are provided with equal gaps therebetween along the lengthwise direction of the contact part 70.

The area of the top electrode 69 above the bottom electrode 68 is formed in a straight line along the bottom electrode 68 in the capacitor area 63. This top electrode 69 integrally includes a facing part 72 that is arranged above the bottom electrode 68 and that faces the bottom electrode 68 with a space therebetween in the thickness direction of the second interlayer insulating film 6, and overlapping parts 73 that extend from the facing part 72 to the sides of the bottom electrode 68 and that face the bottom electrode 68 with a gap therebetween in the direction along the surface of the second interlayer insulating film 6. Due to this, the top electrode 69 is formed in an arch-like shape that covers the bottom electrode 68 from the top and from the sides in a cross-sectional view of the top electrode 69 cut along the widthwise direction.

In this embodiment, the top electrode 69 has the same structure as the wiring line 22 and the dummy wiring line 24. In other words, the top electrode 69 is made of a multilayer structure including an Al alloy wiring line 74 (an Al—Cu alloy wiring line, for example), and barrier films 75 and 76 that sandwich this Al alloy wiring line 74 from above and below. The bottom barrier film 76 and top barrier film 75 are each made of TiN/Ti (TiN for the top layer, Ti for the bottom layer).

The overlapping parts 73 are formed so as to contact the surface of the second interlayer insulating film 6 on both sides of the bottom electrode 68 in the widthwise direction. More specifically, the bottom of the bottommost film (the bottom barrier film 76) of the multilayer structure constituting the top electrode 69 is in contact with the surface of the second interlayer insulating film 6. The Al alloy wiring line 74 and top barrier film 75, which are the other parts of this film, are layered in the direction normal to the surface of the second interlayer insulating film 6. Forming the overlapping parts 73 makes it possible to prevent moisture entering from the sides of the bottom electrode 68. In this embodiment, the boundary between the overlapping parts 73 and the second interlayer insulating film 6 is only constituted of the rear surface of the bottom barrier film 76; there is no multilayer boundary of a multilayer structure constituting the top electrode 69 at this boundary. Therefore, even if moisture enters the multilayer boundary, the moisture can be prevented from entering the bottom electrode 68.

A closed area 77 defined by the arch-shaped top electrode 69 is demarcated around the bottom electrode 68. A capacitance film 78 is disposed in the closed area 77 between the bottom electrode 68 and top electrode 69. The capacitance film 78 is the same material as the insulating film 40, and in this embodiment is a silicon oxide ($SiO_2$) film with a thickness of approximately 20 nm. This capacitance film 78 integrally includes a plane part 79 that is interposed between the facing part 72 of the top electrode 69 and bottom electrode 68 and that covers the top of the bottom electrode 68, and side walls 80 that are between the overlapping parts 73 of the top electrode 69 and bottom electrode 68 and that cover the side faces of the bottom electrode 68. Forming the side walls 80 allows formation of double-structured wall parts on the sides of the bottom electrode 68 with the overlapping parts 73 of the top electrode 69, and these wall parts can reliably prevent moisture entering from the sides of the bottom electrode 68. These side walls 80 can reliably insulate the overlapping parts 73 of the top electrode 69 from the bottom electrode 68.

Due to this, a capacitor with an MIM (metal insulator metal) structure made of the bottom electrode 68, capacitance film 78, and top electrode 69 is disposed in the capacitor area 63.

A TiN layer 81 is present between the top electrode 69 and capacitance film 78. In a plan view, the TiN layer 81 is formed in a thin-film shape having the same outer shape as the bottom electrode 68. This TiN layer 81 faces the bottom electrode 68 across the plane part 79 of the capacitance film 78.

In this embodiment, in the capacitor area 63, a fourth wiring layer 11 further includes a wiring line 82 formed on the surface of a third interlayer insulating film 7.

The area of the wiring line 82 above the top electrode 69 of the third wiring layer 10 is formed in a straight line along the lengthwise direction of the top electrode 69. Due to this, the wiring line 82 and the top electrode 69 face each other in the thickness direction of the third interlayer insulating film 7. The wiring line 82 is electrically connected with the top electrode 69 by a via 83 (a tungsten (W) via, for example) formed in the third interlayer insulating film 7. In this embodiment, the wiring line 82 is made of a multilayer structure including an Al alloy wiring line 84 (an Al—Cu alloy wiring line, for example), and barrier films 85 and 86 that sandwich this Al alloy wiring line 84 from above and below, in a manner similar to the wiring line 43 disposed in the fourth layer 11 of the same layer. The bottom barrier film 86 and top barrier film 85 are each made of TiN/Ti (TiN for the top layer, Ti for the bottom layer).

In the capacitor area 63, a pad opening 87 is formed from the surface of the passivation film 48 through the passivation film 48 and fourth interlayer insulating film 8 such that a portion of the wiring line 82 is selectively exposed as the pad.

FIGS. 8A to 8K are cross-sectional views of one example of the manufacturing steps of the semiconductor device 62 in FIG. 7. The semiconductor substrate 2 is omitted in FIGS. 8A to 8K.

Figure 8A:
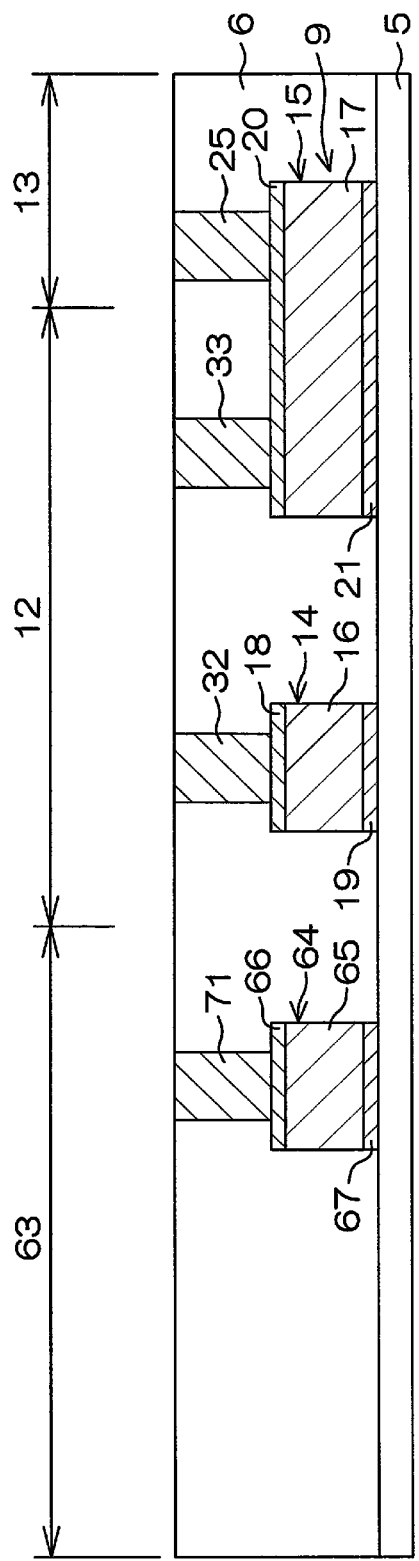
FIG. 8A is a cross-sectional view showing an example of a manufacturing step of the semiconductor device in FIG. 7.

As shown in FIG. 8A, when manufacturing the semiconductor device 62, the first interlayer insulating film 5 is formed on the semiconductor substrate 2 by CVD, for example, after the semiconductor elements 4 have been embedded in a surface 3 of the semiconductor substrate 2 (see FIG. 7 in regards to the semiconductor substrate 2 and the like). Next, via holes (not shown) that selectively expose the semiconductor elements 4 are formed by dry etching, for example, in the first interlayer insulating film 5, and then the vias (not shown) made of tungsten (W) are respectively formed in these via holes.

Next, as shown in FIG. 8A, the TiN/Ti material for the bottom barrier films 19, 21, and 67, the material for the Al alloy wiring lines 16, 17, and 65, and the TiN/Ti material for the top barrier films 18, 20, and 66 are deposited in succession onto the surface of the first interlayer insulating film 5 by sputtering, for example. Next, a resist film (not shown) that selectively covers the areas where the wiring lines 14, 15, and 64 will be formed is formed on these deposited materials, and these deposited materials are dry etched through the resist film. This simultaneously forms the wiring lines 14, 15, and 64 and completes the forming of the second wiring layer 9.

Next, as shown in FIG. 8A, the second interlayer insulating film 6 is layered onto the first interlayer insulating film 5 by CVD, for example, so as to cover the second wiring layer 9. Next, as shown in FIG. 8A, the via holes selectively exposing the wiring lines 14, 15, and 64 are formed in the second interlayer insulating film 6 by dry etching, for example, and then the vias 25, 32, 33, and 71 made of tungsten (W) are formed simultaneously in the respective via holes. The vias 25, 32, 33, and 71 are formed in the respective via holes by the tungsten film being planarized by etch back or CMP after this tungsten film is supplied to the via holes by CVD, for example. Accordingly, the vias 25, 32, 33, and 71 are selectively exposed on the surface of the second interlayer insulating film 6.

Figure 8B:
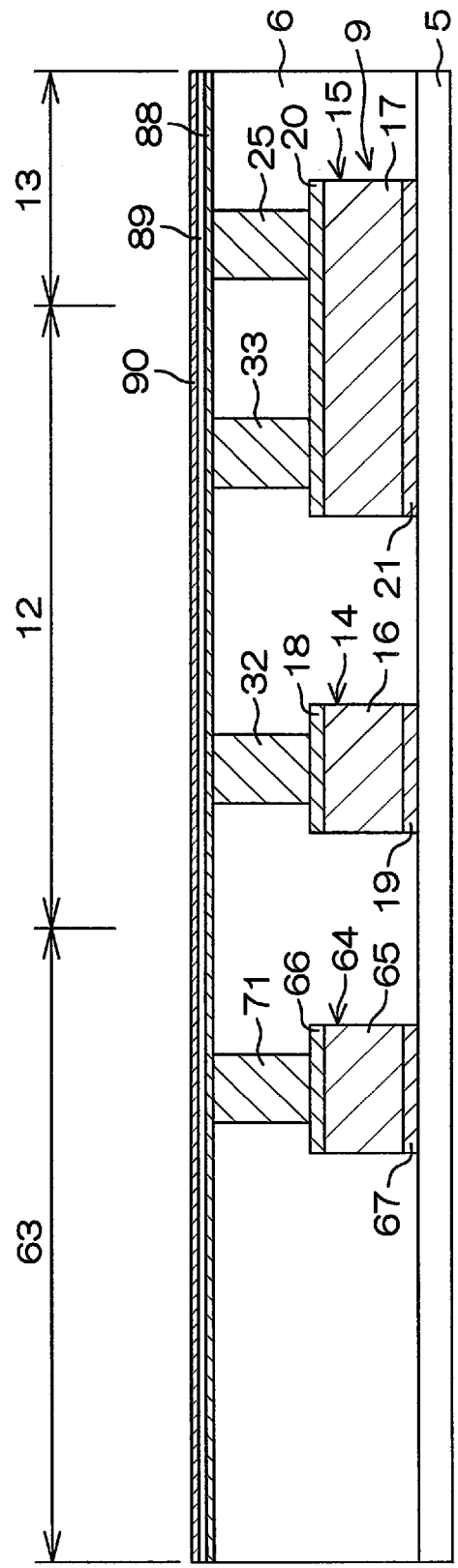
FIG. 8B is a view showing the next manufacturing step after FIG. 8A.

Next, as shown in FIG. 8B, a metal thin-film 88 (TaN in this embodiment), which is the material of the thin-film resistor 23 and bottom electrode 68, is layered onto the second interlayer insulating film 6 by sputtering, for example, so as to contact the vias 25, 32, 33, and 71 exposed on the surface of the second interlayer insulating film 6. After the metal thin-film 88 is layered thereon, a first base film 89 made of silicon oxide ($SiO_2$), which acts as the base for the insulating film 40 and capacitance film 78, is layered onto the metal thin-film 88 by CVD, for example. The metal thin-film 88 has a thickness of 5 nm to 20 nm, for example, and the first base film 89 has a thickness of approximately 20 nm, for example. After forming the first base film 89, a TiN material 90 is layered onto the first base film 89 by sputtering, for example.

Figure 8C:
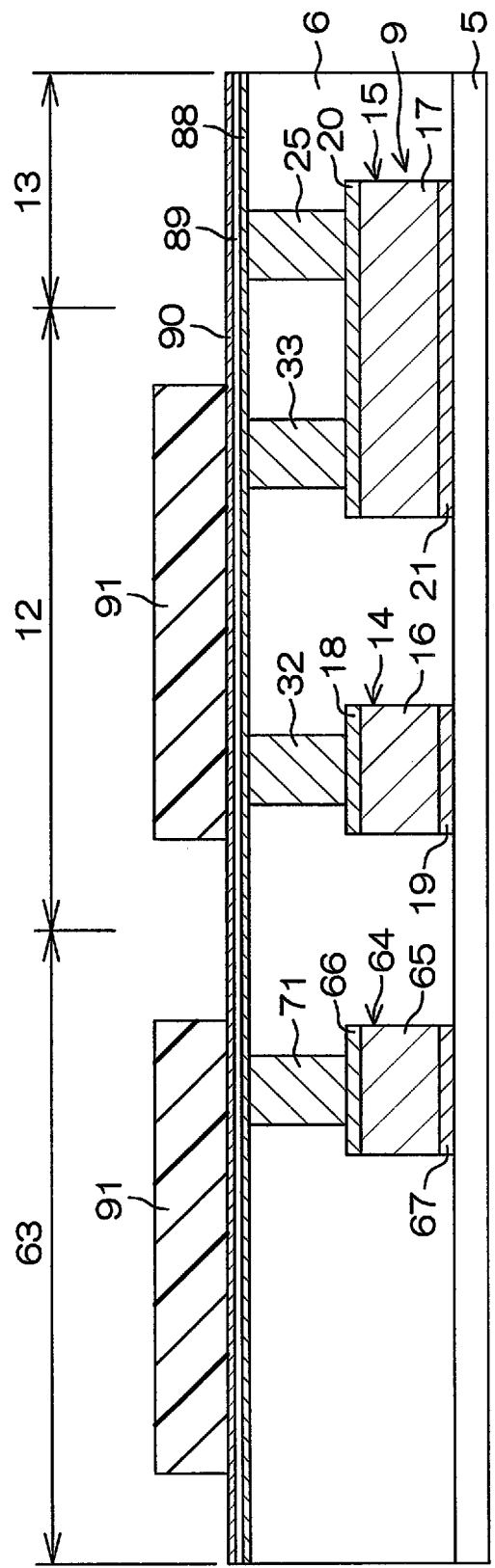
FIG. 8C is a view showing the next manufacturing step after FIG. 8B.

Next, as shown in FIG. 8C, resist films 91 that selectively cover the areas where the thin-film resistor 23 and bottom electrode 68 will be formed are formed onto the TiN material 90.

Figure 8D:
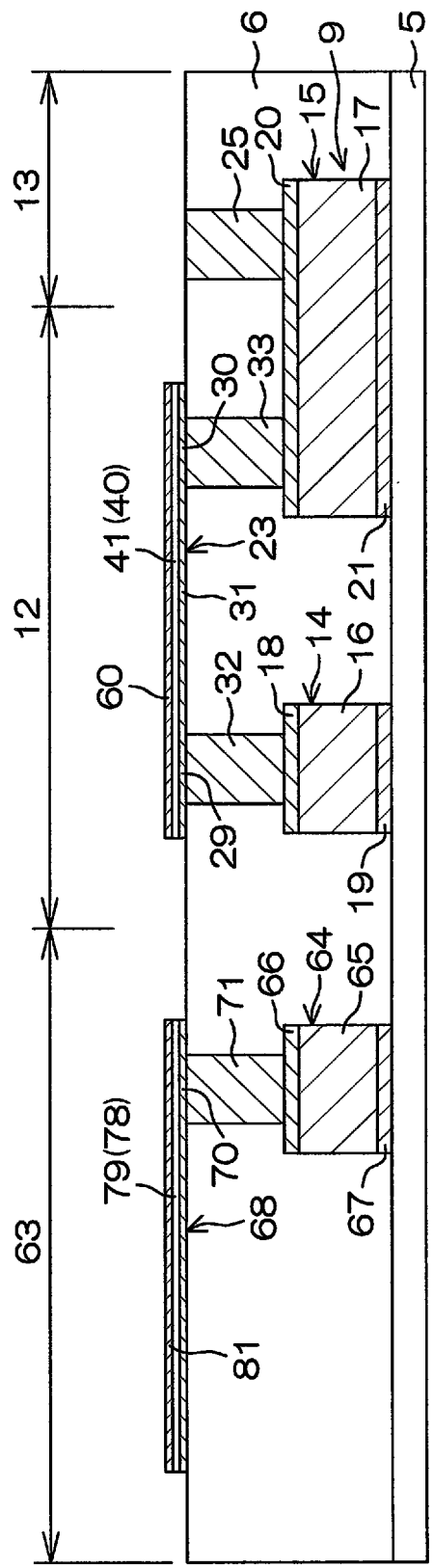
FIG. 8D is a view showing the next manufacturing step after FIG. 8C.

Next, as shown in FIG. 8D, the TiN material 90, first base film 89, and metal thin-film 88 are successively dry etched through the resist films 91. This removes unnecessary portions of the metal thin-film 88 and forms the thin-film resistor 23 and bottom electrode 68. A plane part 41 of the insulating film 40, which covers the top of the thin-film resistor 23 and exposes the side faces of the thin-film resistor 23, is formed on the thin-film resistor 23 at the same time as a plane part 79 formed on the bottom electrode 68, the plane part 79 being part of the capacitance film 78 that covers the top of the bottom electrode 68 and exposes the side faces of the bottom electrode 68. The TiN layers 60 and 81, which have the same outer shape as the thin-film resistor 23 and bottom electrode 68, are respectively formed on the insulating film 40 and capacitance film 78. Thereafter, the resist film 91 is removed by ashing, for example.

Figure 8E:
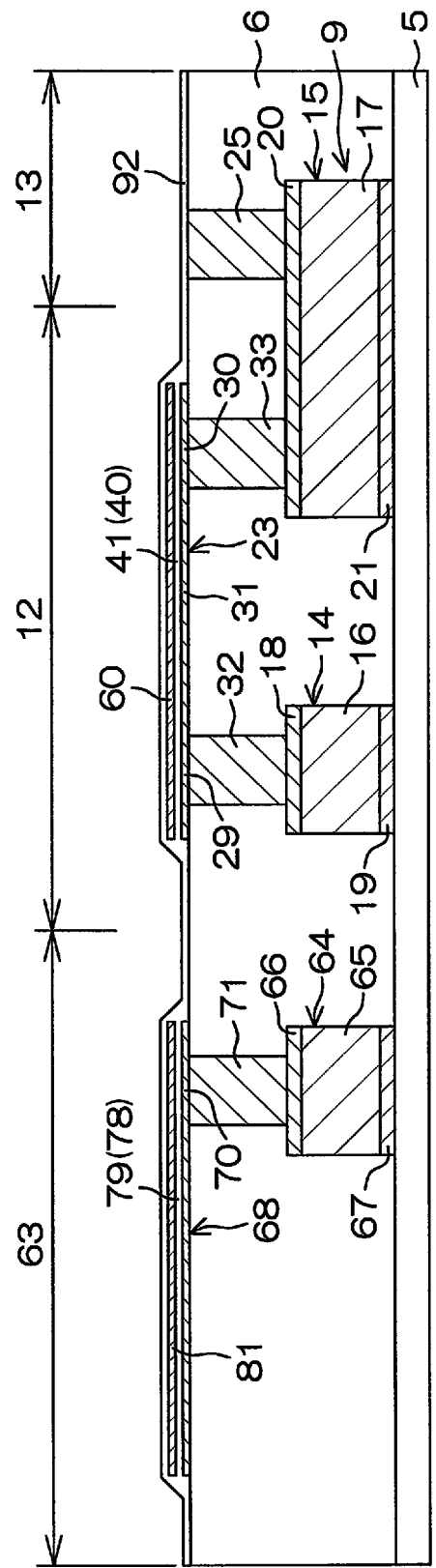
FIG. 8E is a view showing the next manufacturing step after FIG. 8D.

Next, as shown in FIG. 8E, a silicon oxide ($SiO_2$) film with a thickness of approximately 20 nm is further layered onto the second interlayer insulating film 6 by CVD, for example, so as to completely cover the multilayer structure of the thin-film resistor 23, insulating film 40 (plane part 41) and TiN layer 60, and the multilayer structure of the bottom electrode 68, capacitance film 78 (plane part 79) and TiN layer 81. This silicon oxide film is a second base film 92, which is one example of a base film of the present invention, and completely covers the exposed side faces of the thin-film resistor 23 and the bottom electrode 68.

Figure 8F:
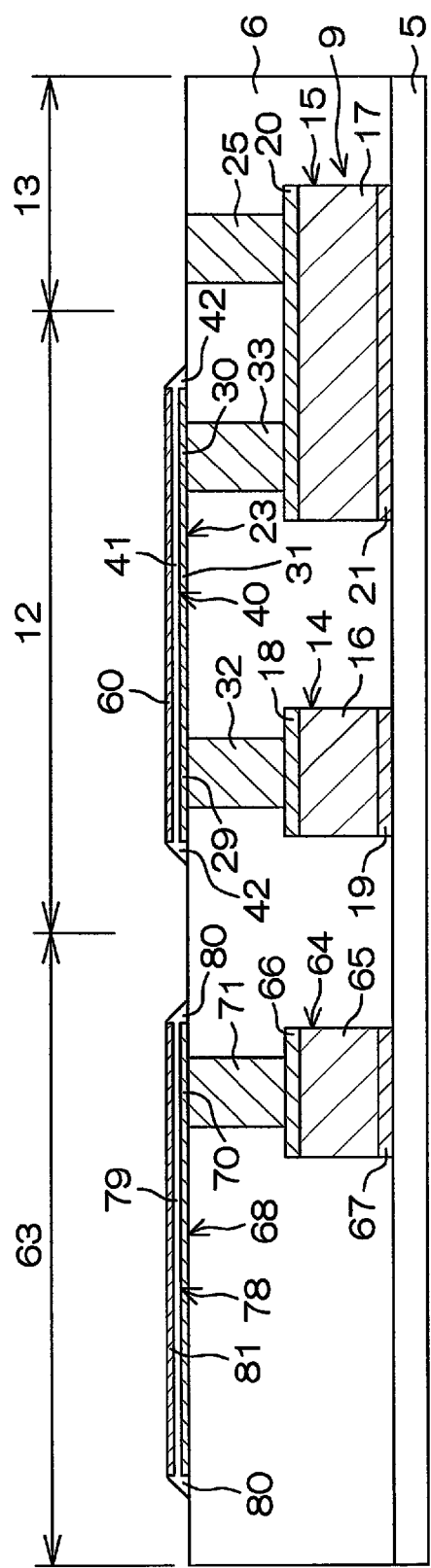
FIG. 8F is a view showing the next manufacturing step after FIG. 8E.

Next, as shown in FIG. 8F, the second base film 92 is removed successively from the top by etch back, for example. The etch back is performed until the top of the via 25 is exposed on the surface of the second interlayer insulating film 6, for example. This removes all portions of the second base film 92 except those portions that will act as the side walls 42 and 80, and selectively exposes the via 25 on the surface of the second interlayer insulating film 6. The remaining portions of the second base film 92 form the side walls 42 and 80. Due to this, the insulating film 40 and capacitance film 78 are formed at the same time.

Figure 8G:
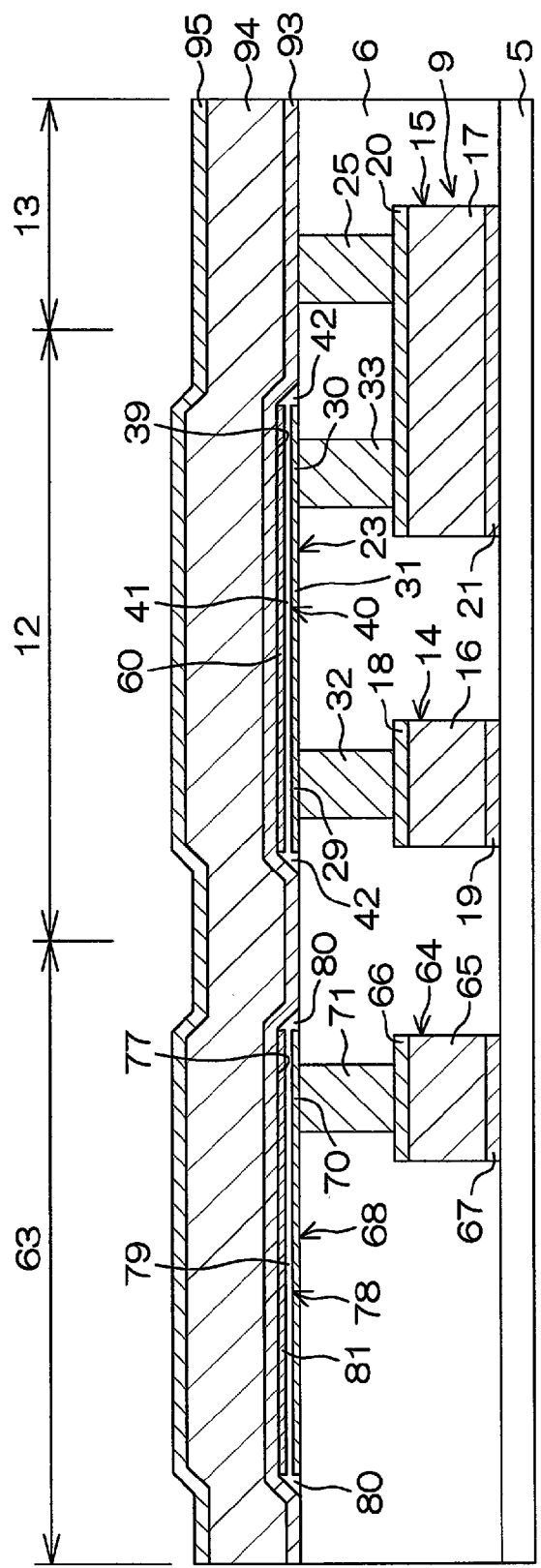
FIG. 8G is a view showing the next manufacturing step after FIG. 8F.

Next, as shown in FIG. 8G, TiN/Ti material 93 of the bottom barrier films 28, 38, and 76, Al alloy material 94 of the Al alloy wiring lines 26, 36, and 74, and TiN/Ti material 95 of the top barrier films 27, 37, and 75 are successively deposited onto the surface of the second interlayer insulating film 6 by sputtering, for example, so as to completely cover the TiN layers 60 and 81.

Figure 8H:
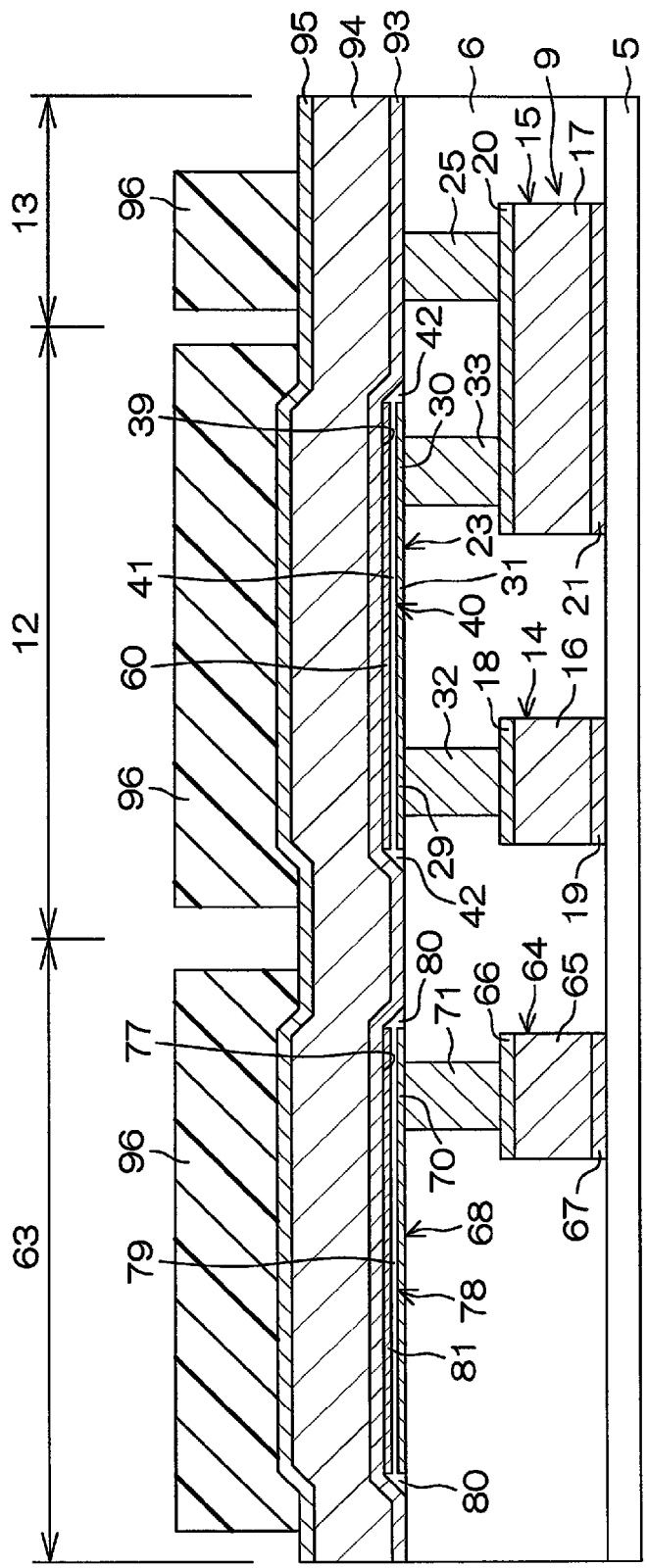
FIG. 8H is a view showing the next manufacturing step after FIG. 8G.

Next, as shown in FIG. 8H, resist films 96 that selectively cover areas where the wiring line 22, dummy wiring line 24, and top electrode 69 will be formed are formed on the TiN/Ti material 95.

Figure 8I:
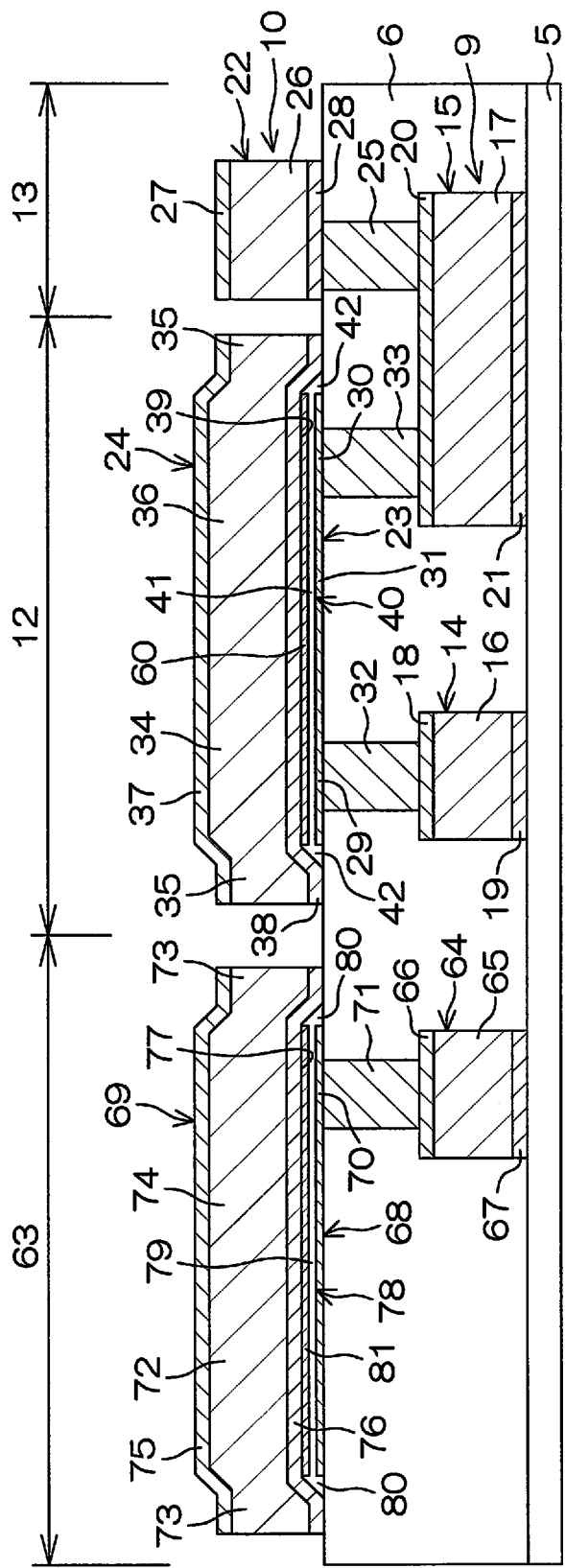
FIG. 8I is a view showing the next manufacturing step after FIG. 8H.

Next, as shown in FIG. 8I, the TiN/Ti material 95, Al alloy material 94, and TiN/Ti material 93 are successively dry etched through the resist films 96. Due to this, the wiring line 22, dummy wiring line 24, and top electrode 69 are formed at the same time, thereby completing the forming of the third wiring layer 10.

Figure 8J:
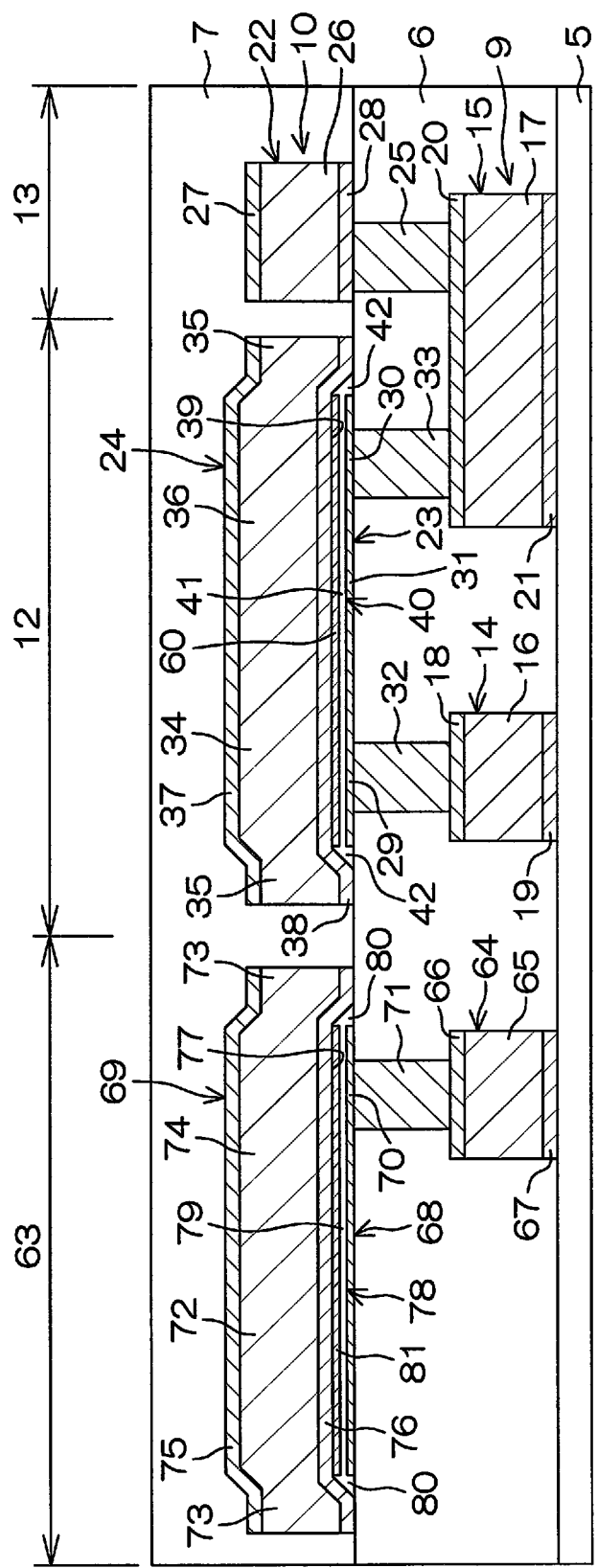
FIG. 8J is a view showing the next manufacturing step after FIG. 8I.

Next, as shown in FIG. 8J, the third interlayer insulating film 7 is layered onto the second interlayer insulating film 6 by CVD, for example, so as to cover the third wiring layer 10.

Figure 8K:
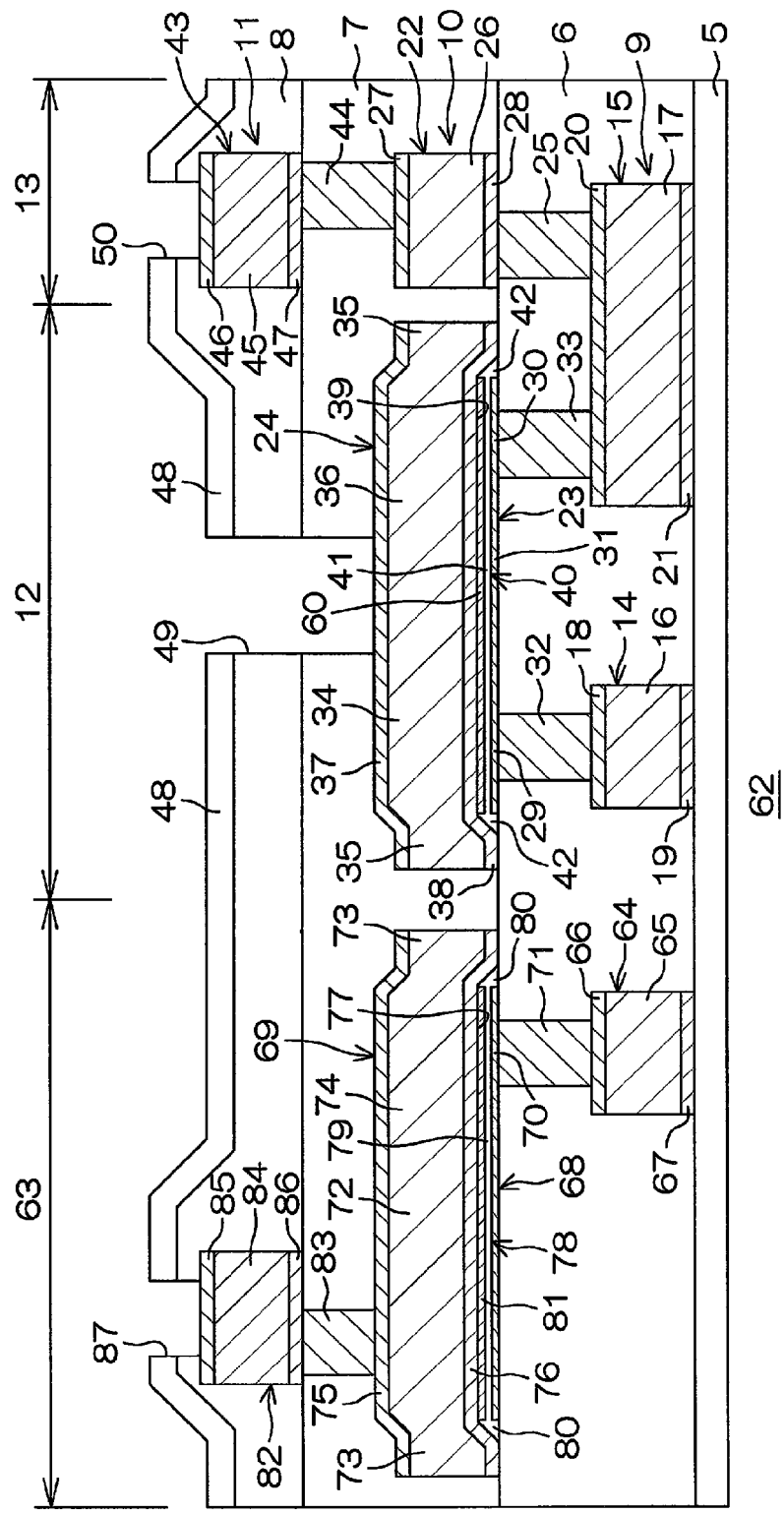
FIG. 8K is a view showing the next manufacturing step after FIG. 8J.

Next, as shown in FIG. 8K, the respective via holes selectively exposing the wiring line 22 and top electrode 69 are formed in the third interlayer insulating film 7 by dry etching, for example, and then the vias 44 and 83 made of tungsten (W) are respectively formed in these via holes. The vias 44 and 83 are formed in the respective via holes by the tungsten film being planarized by etch back or CMP after this tungsten film is supplied to the via holes by CVD, for example. Accordingly, the vias 44 and 83 are selectively exposed on the surface of the third interlayer insulating film 7.

Next, as shown in FIG. 8K, the TiN/Ti material for the bottom barrier films 47 and 86, the material for the Al alloy wiring lines 45 and 84, and the TiN/Ti material for the top barrier films 46 and 85 are deposited in succession onto the surface of the third interlayer insulating film 7 by sputtering, for example. Next, a resist film (not shown) that selectively covers the area where the wiring lines 43 and 82 will be formed is formed on these deposited materials, and these deposited materials are dry etched through the resist film. This simultaneously forms the wiring lines 43 and 82 and completes the forming of the fourth wiring layer 11.

Next, as shown in FIG. 8K, after the fourth interlayer insulating film 8 is layered onto the third interlayer insulating film 7 so as to cover the third wiring layer 10, and the passivation film 48 is layered onto the fourth interlayer insulating film 8 by CVD, for example. After the passivation film 48 is formed, a resist film (not shown) with openings where a fuse window 49 and pad openings 50 and 87 will be formed is formed on the passivation film 48. The fuse window 49 and pad openings 50 and 87 are formed at the same time by dry etching the passivation film 48 and the like through this resist film. Thereafter, as described above, laser trimming is performed to achieve a desired resistance by emitting a laser through the fuse window 49. The semiconductor device 62 as shown in FIG. 7 is obtained by the steps above.

As described above, according to this method, it is possible to form an MIM structure made of the bottom electrode 68, capacitance film 78, and top electrode 69 in the same step as the thin-film resistor 23, insulating film 40, and dummy wiring line 24 in the resistor area 12; therefore, the thin-film resister 23 and MIM structure can be consolidated while preventing an increase in process steps in the manufacturing process.

Furthermore, reaction between the top electrode 69 and capacitance film 78 can be suppressed by the TiN layer 81, which has relatively weak reduction characteristics, being interposed between the top electrode 69 and the capacitance film 78 ($SiO_2$ film). Due to this, production of $TiO_2$ due to a reaction between the Ti film of the barrier film 76 of the top electrode 69 and the capacitance film 78 can be prevented and connection between the bottom electrode 68 and top electrode 69 can be prevented, in a manner similar to the TiN layer 60 of Embodiment 2 described above.

Needless to say, effects similar to Embodiments 1 and 2 can also be achieved with this semiconductor device 62.

Figure 9:
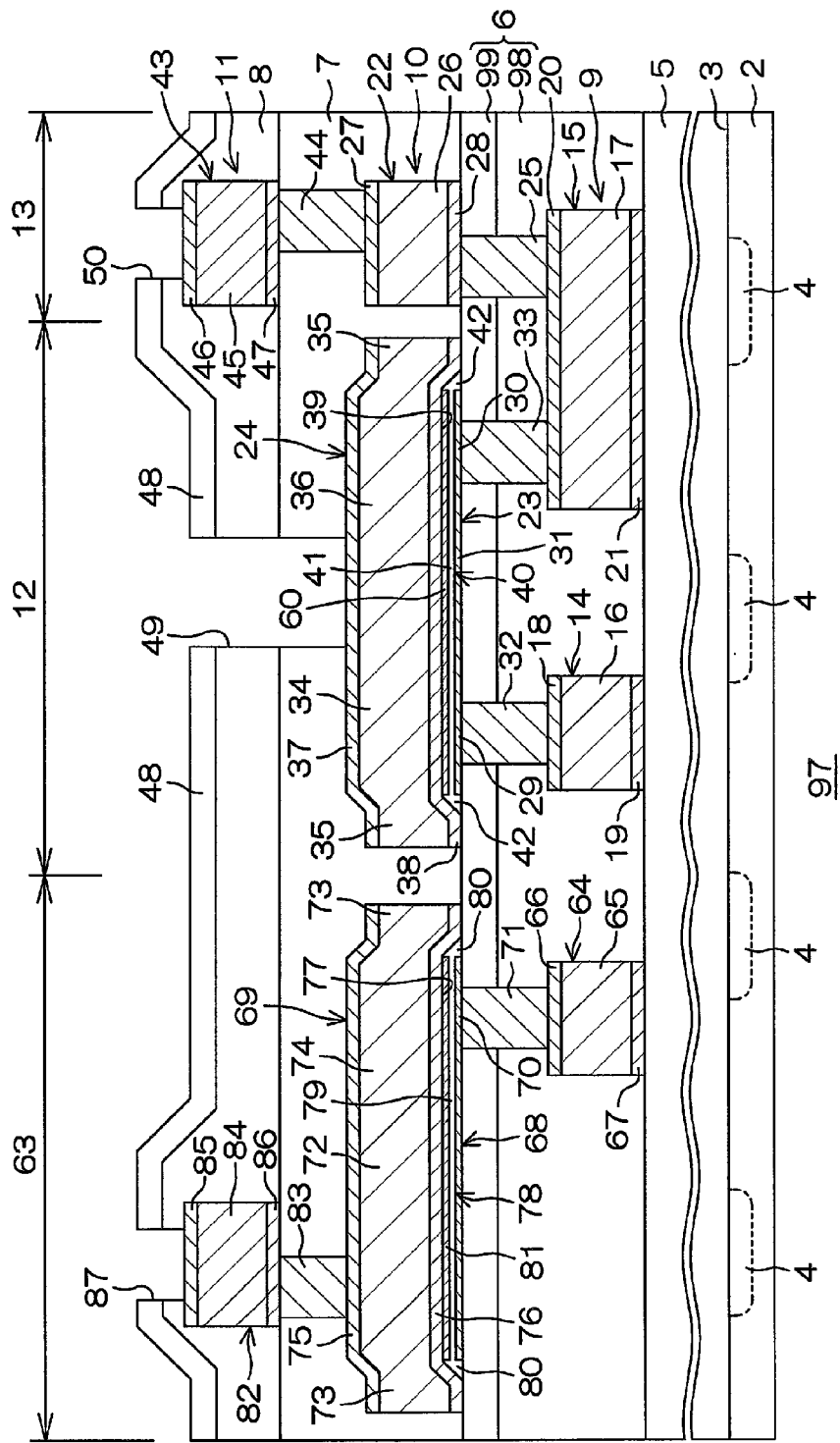
FIG. 9 is a cross-sectional view of a semiconductor device according to Embodiment 4 of the present invention.

FIG. 9 is a cross-sectional view of a semiconductor device 97 according to Embodiment 4 of the present invention. In FIG. 9, portions corresponding to the portions in FIG. 7 are assigned the same reference characters.

In this semiconductor device 97, a second interlayer insulating film 6 is a two-layer structure, in addition to the configuration of the semiconductor device 62 described above. Specifically, the second interlayer insulating film 6 includes a bottom layer $SiO_2$ film 98, and a top layer SiN film 99, which is an example of an etching stopper according to the present invention.

The bottom layer $SiO_2$ film 98 has a thickness that completely covers a second wiring layer 9. In other words, the top of the $SiO_2$ film 98 is positioned further above the tops of the respective wiring lines of the second wiring layer 9. The top layer SiN film 99 is layered onto this $SiO_2$ film 98 and forms the outermost surface of the second interlayer insulating film 6. Accordingly, vias 25, 32, 33, and 71 that electrically connect the second wiring layer 9 and third wiring layer 10 are formed so as to pass through the boundary of the $SiO_2$ film 98 and SiN film 99.

The manufacturing steps of the semiconductor device 97 of this embodiment are substantially similar to the steps shown in FIGS. 8A to 8K. However, in the step in FIG. 3A, the $SiO_2$ film 98 and SiN film 99 are layered successively from the first interlayer insulating film 5 by CVD when forming the second interlayer insulating film 6.

Figure 10A:
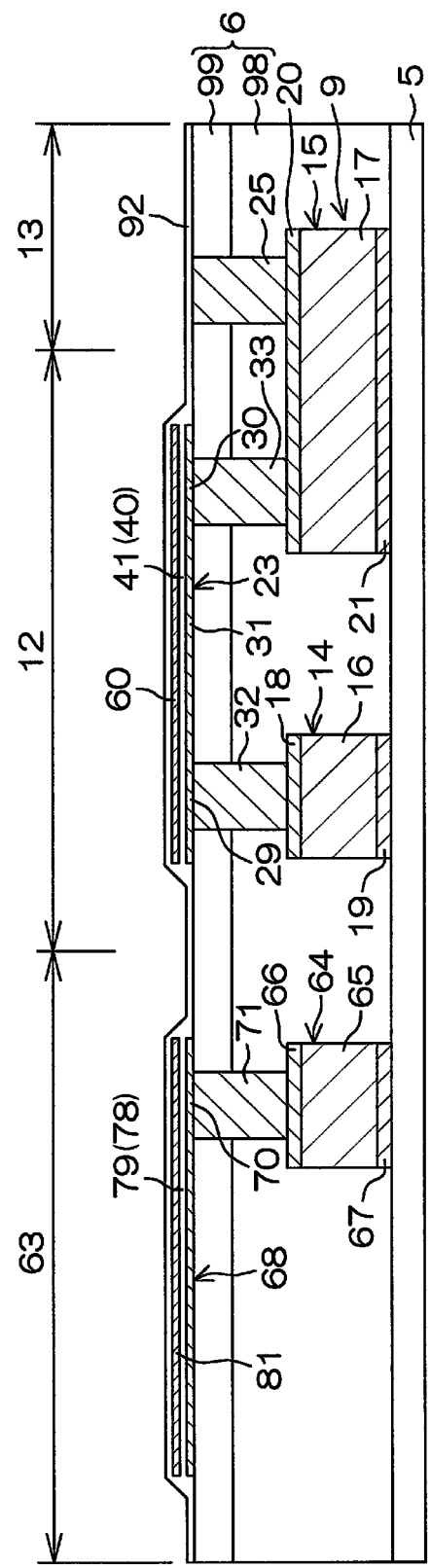
FIG. 10A is a cross-sectional view showing an example of a manufacturing step of the semiconductor device in FIG. 9.
Figure 10B:
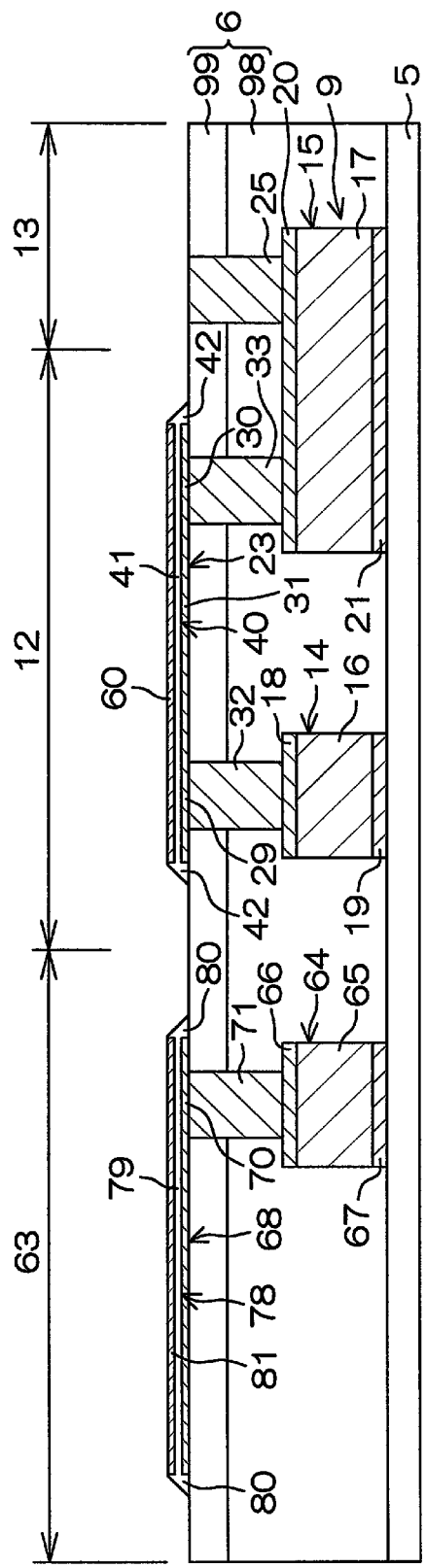
FIG. 10B is a view showing the next manufacturing step after FIG. 10A.

According to this semiconductor device 97, the SiN film 99 made of an insulating material (SiN in this embodiment), which has etching selectivity with respect to the $SiO_2$ constituting the insulating film 40 and capacitance film 78, is formed on the outermost surface of the second interlayer insulating film 6. As a result, as shown in FIGS. 10A and 10B, when etching a second base film 92 as in the steps in FIGS. 8E and 8F to form the insulating film 40 and capacitance film 78, over-etching of the second interlayer insulating film 6 can be prevented. Due to this, the flatness of the second interlayer insulating film 6 can be ensured. Needless to say, effects similar to Embodiments 1 to 3 can also be achieved in this semiconductor device 97.

In this embodiment, the outermost surface of the second interlayer insulating film 6 needs to be an insulating material that has etching selectivity with respect to $SiO_2$; thus, the second interlayer insulating film 6 may be a three-layer structure, four-layer structure, or the like provided with an SiN film on the uppermost layer, for example. The film forming the outermost surface may be an SiOx film (an oxide film with a comparatively large Si composition ratio), an SiC film, or an SiCN film, instead of the SiN film 99, for example.

If the insulating film 40 and capacitance film 78 are made of SiN, it is preferable that the second interlayer insulating film 6 be a single-layer structure of an $SiO_2$ film that has etching selectivity with respect to SiN. This can also prevent over-etching of the second interlayer insulating film 6.

Embodiments of the present invention were described above, but the present invention can also be implemented in other embodiments.

The features disclosed in the embodiments described above can also be combined together among different embodiments. The constituting elements expressed in the respective embodiments can be combined together within the scope of the present invention.

Besides these, various modifications in design can be made within the scope of the claims.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device having a capacitor area and a wiring area selectively disposed on a semiconductor substrate, comprising:
    an interlayer insulating film disposed above the semiconductor substrate;
    a thin-film metal film that is disposed on the interlayer insulating film and that is in the capacitor area, the thin-film metal film serves as a bottom electrode of the capacitor;
    a via that is formed in the interlayer insulating film and that contacts the thin-film metal film from below;
    a wiring line that is disposed above the interlayer insulating film and that is in the wiring area;
    a first dummy wiring line that is disposed in a wiring layer in the same layer as the wiring line and that covers the thin-film metal film from above, the first dummy wiring line serves as a top electrode of the capacitor; and
    a capacitor dielectric film interposed between the thin-film metal film and the first dummy wiring line.

2. The semiconductor device according to claim 1, wherein the first dummy wiring line includes overlapping parts that cover the thin-film metal film from sides thereof.

3. The semiconductor device according to claim 1, wherein the capacitor dielectric film includes side walls that cover respective side faces of the thin-film metal film.

4. The semiconductor device according to claim 1, further comprising a second interlayer capacitor dielectric film formed on the interlayer insulating film so as to cover the wiring line and the first dummy wiring line,
    wherein the second interlayer insulating film has a via hole formed therein selectively exposing a top of the first dummy wiring line.

5. The semiconductor device according to claim 1,
    wherein the capacitor dielectric film is an SiO2 film, and
    wherein the semiconductor device further includes a TiN layer interposed between the first dummy wiring line and the SiO2 film.

6. The semiconductor device according to claim 1, wherein the capacitor dielectric film is an SiO2 film, and
wherein the interlayer insulating film has, on an outermost surface thereof, an etching stopper made of an insulating material that has etching selectivity with respect to SiO2.

7. The semiconductor device according to claim 6, wherein the etching stopper is made of an SiN film.

8. The semiconductor device according to claim 1, wherein the thin-film metal film is made of SiCr, NiCr, TaN, or TiN.

9. The semiconductor device according to claim 1, wherein the first dummy wiring line has a lamination structure that is same as the wiring line.

10. The semiconductor device according to claim 9, wherein both of the first dummy wiring line and the wiring line have a multilayer configuration including an Al alloy wiring line and barrier films that respectively sandwich said Al alloy wiring line from above and below.

11. The semiconductor device according to claim 1, further comprising a resistor area disposed on the semiconductor substrate,
wherein said resistor area includes:
a thin film resistor disposed on the interlayer insulating film;
a second dummy wiring line disposed in a wiring layer that is in the same layer as the wiring line, the second dummy wiring line facing the thin film resistor; and
an insulating film interposed between the thin film resistor and the second dummy wiring line.

\* \* \* \* \*